(12) United States Patent
Giraldo et al.

(10) Patent No.: US 10,110,263 B2
(45) Date of Patent: Oct. 23, 2018

(54) CROSSTALK-CORRECTION IN DIGITIZERS USING COUPLING COEFFICIENTS

(71) Applicant: Roshmere, Inc., San Diego, CA (US)

(72) Inventors: Eduardo Temprana Giraldo, La Jolla, CA (US); Nikola Alic, La Jolla, CA (US)

(73) Assignee: Roshmere, Inc., San Diego, CA (US)

( * ) Notice: Subject to any disclaimer, the term of this patent is extended or adjusted under 35 U.S.C. 154(b) by 0 days.

(21) Appl. No.: 15/884,182

(22) Filed: Jan. 30, 2018

(65) Prior Publication Data
US 2018/0219565 A1 Aug. 2, 2018

Related U.S. Application Data

(60) Provisional application No. 62/453,394, filed on Feb. 1, 2017.

(51) Int. Cl.
*H04K 1/02* (2006.01)
*H04L 25/03* (2006.01)
(Continued)

(52) U.S. Cl.
CPC ............ *H04B 1/0475* (2013.01); *H03M 1/06* (2013.01); *H04B 1/1081* (2013.01); *H04B 1/0003* (2013.01)

(58) Field of Classification Search
CPC .. H04B 1/0475; H04B 1/1081; H04B 1/0003; H03M 1/06
See application file for complete search history.

(56) References Cited

U.S. PATENT DOCUMENTS

| 5,311,550 A | 5/1994 | Fouche et al. |
| 6,711,215 B1 | 3/2004 | Tziony et al. |
| (Continued) | | |

FOREIGN PATENT DOCUMENTS

| WO | 2015062544 A1 | 5/2015 |
| WO | 2016176642 A1 | 11/2016 |

OTHER PUBLICATIONS

Office Action dated Apr. 18, 2018 for U.S. Appl. No. 15/885,091.
(Continued)

*Primary Examiner* — Shuwang Liu
*Assistant Examiner* — Sung Ahn
(74) *Attorney, Agent, or Firm* — The Mueller Law Office, P.C.

(57) ABSTRACT

In a system, known digitizer signals (known analog signals or digital representations of known analog signals) are generated. The known digitizer signals are input into digitizers (analog-to-digital converter (ADCs) or digital-to-analog converter (DACs)) to output generated digitizer signals (generated digital representations or generated analog signals). The generated digitizer signals are analyzed in relation to the known digitizer signals to generate coupling coefficients, which can be either scalar quantities or finite-impulse-response (FIR) filter functions. Subsequent digitizer signals are generated. The subsequent digitizer signals are modified using the coupling coefficients to generate modified digitizer signals according to formulae. The modified digitizer signals are used directly as digital representations, or are input to the DACs to output modified analog signals that substantially match subsequent analog signals.

28 Claims, 15 Drawing Sheets

(51) Int. Cl.
*H04L 25/49* (2006.01)
*H04B 1/04* (2006.01)
*H04B 1/10* (2006.01)
*H03M 1/06* (2006.01)
*H04B 1/00* (2006.01)

(56) References Cited

U.S. PATENT DOCUMENTS

| | | | |
|---|---|---|---|
| 7,706,434 | B1 | 4/2010 | Farjadrad et al. |
| 7,756,421 | B2 | 7/2010 | Roberts et al. |
| 7,877,060 | B1 | 1/2011 | Khlat et al. |
| 8,909,061 | B1 | 12/2014 | Varadarajan |
| 9,166,828 | B1 | 10/2015 | Nabar et al. |
| 9,525,475 | B1 | 12/2016 | Gan |
| 9,577,657 | B1 | 2/2017 | Clara |
| 2003/0112164 | A1* | 6/2003 | Scanlan ............. H03M 1/0863 341/135 |
| 2005/0118963 | A1 | 6/2005 | Chiu |
| 2005/0169393 | A1* | 8/2005 | Lozhkin ............ H04L 25/03171 375/260 |
| 2006/0159002 | A1 | 7/2006 | Kim et al. |
| 2008/0025381 | A1 | 1/2008 | Lee et al. |
| 2012/0105262 | A1* | 5/2012 | Rao .................. H03M 1/123 341/155 |
| 2015/0071390 | A1 | 3/2015 | Muhammad |
| 2015/0295643 | A1 | 10/2015 | Zhao et al. |
| 2016/0094296 | A1 | 3/2016 | Hongou |
| 2016/0105251 | A1* | 4/2016 | Cheng ............. H04B 10/25759 398/68 |
| 2016/0241341 | A1 | 8/2016 | Endo et al. |

OTHER PUBLICATIONS

International Search Report dated May 10, 2018 for PCT Patent Application No. PCT/US2018/016202.
International Search Report dated May 31, 2018 for PCT Patent Application No. PCT/US2018/016113.

* cited by examiner

CROSSTALK-CORRECTION IN DIGITIZERS USING COUPLING COEFFICIENTS

RELATED APPLICATIONS

The application claims the benefit of U.S. Provisional Patent Application No. 62/453,394 filed on Feb. 1, 2017, and entitled "CROSSTALK-CORRECTION IN DIGITIZERS USING COUPLING COEFFICIENTS;" which is hereby incorporated by reference for all purposes.

BACKGROUND OF THE INVENTION

Digitizers, such as digital-to-analog converters (DACs) and analog-to-digital converters (ADCs), are indispensable elements in many systems, such as optical communication systems, wireless communication systems, satellite communication systems, computer data storage systems, image processing systems, video processing systems, sound processing systems, and controls systems, among others. The ability to generate and/or represent waveforms that closely adhere to waveforms as defined by system designers is of prime importance in many engineering areas. For example, accurate acquisition of waveforms and their digitization is a key component of contemporary signal processing systems.

Digitizers serve the purpose of converting information between the analog and digital domains. Analog-to-Digital Converters (ADC) capture analog physical quantities (current or voltages) by periodically measuring discrete samples, quantizing their amplitude into discrete values, and encoding them into their equivalent digital representations or values. Conversely, Digital-to-Analog Converters (DAC) generate analog signals from digital values by creating physical impulses (e.g., current or voltages) with amplitudes that correspond to the digital values. In this manner, for example, an analog signal or waveform can be converted into an equivalent digital signal or waveform, and vice versa.

Multichannel DACs and ADCs are typically used in communication systems that encode information in the electric field of electromagnetic waves. Two-channel DACs are often used to generate an analog representation of the real and imaginary (i.e., in-phase and quadrature) components of the full electric field; whereas, two-channel ADCs are often used to capture the digital representation of the real and imaginary (i.e., in-phase and quadrature components) of the full electric field. For example, four-channel digitizers (e.g., DACs/ADCs) are used in an optical communication system to generate and capture the real and imaginary components (sometimes referred to as in-phase and quadrature components) for each of two polarizations of the full electric field.

Each channel of some multichannel DACs includes a DAC for each respective channel, where each channel's respective DAC includes a respective digital input and a respective analog output. Likewise, each channel of some multichannel ADCs includes an ADC for each respective channel, where each channel's respective ADC includes a respective analog input and a respective digital output.

Unfortunately, inaccuracies created during the process of digitization negatively impact system performance. Some methods for improving the response of multichannel DACs and multichannel ADCs apply equalization methods to the digitizer ports independently. However, the attainable level of improvement in performance accuracy remains limited by crosstalk between those ports. Crosstalk between digitizer ports is often present due to the tight packaging used between individual digitizer devices in very large scale integration (VLSI) technology, which causes digitizer signals to leak to adjacent ports during signal digitization.

Some methods attempt to improve digitization accuracy/fidelity of the digitizers by separately digitally filtering each of the DAC or ADC ports, but these solutions generally have a residual error in attainable fidelity. Other methods attempt to improve digitization accuracy using look-up-tables, but these methods still are unable to circumvent the effects of crosstalk between the ports. Thus, the digitizers fall short from their expected accuracy.

SUMMARY OF INVENTION

In some embodiments, a method is disclosed for generating and using coupling coefficients to reduce, mitigate or eliminate ("correct") the effects of parasitic crosstalk in multichannel outputs of digital-to-analog converters and in multichannel inputs of analog-to-digital converters.

In some embodiments a method is disclosed, which includes providing first digital representations of a first analog signal, and inputting the first digital representations into a multichannel DAC with crosstalk between the channels. The crosstalk between the channels is analyzed to determine coupling coefficients for crosstalk strength between the channels. Second digital representations of a second analog signal are provided, and the second digital representations are pre-compensated using the determined coupling coefficients. The pre-compensated second digital representations are inputs into the multichannel DAC to produce the second analog signals, wherein the crosstalk between the channels of the produced second analog signals is mitigated.

In some embodiments a method is disclosed, which includes providing a first analog signal with corresponding first digital representations, and inputting the first analog signals into a multichannel ADC with crosstalk between the channels. The crosstalk between the channels is analyzed to determine coupling coefficients for crosstalk strength between the channels. Second analog signal with corresponding second digital representations are provided, the second analog signals are inputs into the multichannel ADC to produce the second digital representations using the multichannel ADC. The produced second digital representations are post-compensated using the determined coupling coefficients, wherein the crosstalk between the channels of the produced second digital representations is mitigated.

In some embodiments, one or more systems carry out one or more steps of a method that involves generating first and second known digital representations of first and second known analog signals ($X_1$ and $X_2$), respectively. The method also involves inputting the first and second known digital representation to first and second digital-to-analog converters (DACs), respectively, to output first and second generated analog signals ($Y_1$ and $Y_2$), respectively. The method also involves analyzing the first and second generated analog signals in relation to the first and second known analog signal to generate a coupling coefficient ($cc_{12}$) for crosstalk strength from the first to the second DAC according to a formula $Y_2 = X_2 + cc_{12} \times X_1$, and a coupling coefficient ($cc_{21}$) for crosstalk strength from the second to the first DAC according to a formula $Y_1 = X_1 + cc_{21} \times X_2$. The method also involves generating a first subsequent digital representation ($Z_1$) of a first subsequent analog signal. The method also involves generating a second subsequent digital representation ($Z_2$) of a second subsequent analog signal. The method also involves modifying the first subsequent digital representation ($Z_1$) to generate a first modified digital representation ($Z_{1\#}$). The method also involves modifying the second subsequent digital representation ($Z_2$) to generate a second modified digital representation ($Z_{2\#}$). The method also involves inputting the first and second modified digital representations to the first and second DACs, respectively, to output first and second modified analog signals that substantially match the first and second subsequent analog signals, respectively. In some embodiments, the coupling coefficients $cc_{12}$ and $cc_{21}$ are scalar quantities, $Z_{1\#}=(Z_1\ cc_{21}\times Z_2)/(1\ cc_{12}\times cc_{21})$, and $Z_{2\#}=(Z_2-cc_{12}\times Z_1)/(1\ cc_{12}\times cc_{21})$. In some embodiments, the coupling coefficients $cc_{12}$ and $cc_{21}$ are finite-impulse-response (FIR) filter functions, $Z_{1\#}=Z_1-cc_{21}\times Z_2$, and $Z_{2\#}=Z_2-cc_{12}\times Z_1$. In the cases where the coupling coefficients $cc_{12}$ and $cc_{21}$ are non-scalar (e.g., vectors, functions, or finite-impulse-response (FIR) filter functions), "×" in the formulas above represent the convolution (or filtering) operation.

In some embodiments, one or more systems carry out one or more steps of a method that involves generating first and second known analog signals having first and second known digital representations ($A_1$ and $A_2$), respectively. The method also involves inputting the first and second known analog signals to first and second analog-to-digital converters (ADCs), respectively, to output first and second generated digital representations ($B_1$ and $B_2$), respectively. The method also involves analyzing the first and second generated digital representations in relation to the first and second known digital representations to generate a coupling coefficient ($bb_{12}$) for crosstalk strength from the first to the second ADC according to a formula $B_2=A_2\ bb_{12}\times A_1$, and a coupling coefficient ($bb_{21}$) for crosstalk strength from the second to the first ADC according to a formula $B_1=A_1+bb_{21}\times A_2$. The method also involves inputting a first subsequent analog signal to the first ADC to output a first subsequent digital representation ($D_1$) of the first subsequent analog signal. The method also involves inputting a second subsequent analog signal to the second ADC to output a second subsequent digital representation ($D_2$) of the second subsequent analog signal. The method also involves modifying the first subsequent digital representation ($D_1$) to generate a first crosstalk-corrected digital representation ($D_{1\#}$). The method also involves modifying the second subsequent digital representation ($D_2$) to generate a second crosstalk-corrected digital representation ($D_{2\#}$). In some embodiments, the coupling coefficients $bb_{12}$ and $bb_{21}$ are scalar quantities, $D_{1\#}=(D_1=bb_{12}\times D_2)/(1-bb_{12}\times bb_{21})$, and $D_{2\#}=(D_2-bb_{12}\times D_1)/(1-bb_{12}\times bb_{21})$. In some embodiments, the coupling coefficients $bb_{12}$ and $bb_{21}$ are finite-impulse-response (FIR) filter functions, $D_{1\#}=D_1-bb_{21}\times D_2$, and $D_{2\#}=D_2-bb_{12}\times D_1$. In the cases where the coupling coefficients $bb_{12}$ and $bb_{21}$ are non-scalar (e.g., vectors, functions, or finite-impulse-response (FIR) filter functions), "×" in the formulas above represent the convolution (or filtering) operation.

DETAILED DESCRIPTION OF THE EMBODIMENTS

In some embodiments, a method is disclosed for generating and using coupling coefficients to reduce, mitigate or eliminate ("correct") the effects of parasitic crosstalk in multichannel outputs of digital-to-analog converters and in multichannel inputs of analog-to-digital converters. The methods described herein are applicable to any multichannel systems employing digitizers, which experience cross-talk between the channels. Some non-limiting examples of such systems are optical communication systems (such as a free-space optical communication system, or a fiber-optic optical communication system), wireless communication systems (such as a radio-frequency (RF) communication system), satellite communication systems, computer data storage systems, image processing systems, video processing systems, sound processing systems, and controls systems, among others.

Some embodiments are directed to increasing multichannel digitizer accuracy/fidelity for waveform generation (in the case of DACs) and for waveform acquisition (in the case of ADCs) by jointly correcting the digitization-generated response of crosstalk between digitizer outputs/inputs ("ports"). Crosstalk, although severely harmful and limiting to the ability of precise digitization of signal waveforms (e.g., electric fields), is a deterministic effect. That is, the same collection of patterns on a set of digitizer ports will produce the same impairments. Consequently, the effects of crosstalk can be characterized using known (e.g., predetermined) signals, and elements of the characterization can be used to reduce or eliminate ("correct") the effects of crosstalk during the process of waveform digitization through pre-compensation (i.e., applying the correction before the crosstalk occurs), or post-compensation (i.e., applying the correction after the crosstalk occurs). Thus, patterns generated simultaneously on the interfering outputs will cancel out the interference due to crosstalk, thereby producing outputs free (or almost free) of the unwanted crosstalk, and consequently generate signals of higher accuracy/fidelity.

Figure 1A:
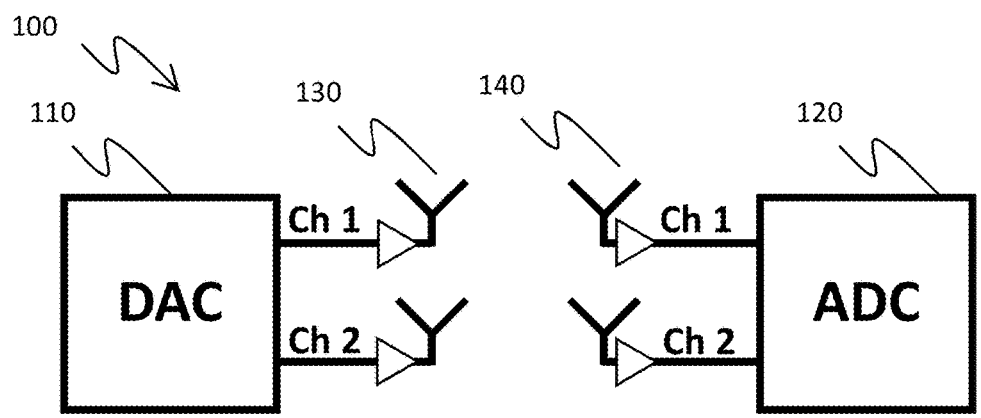
FIGS. 1A and 1B show simplified schematic diagrams of communication systems.
Figure 1B:
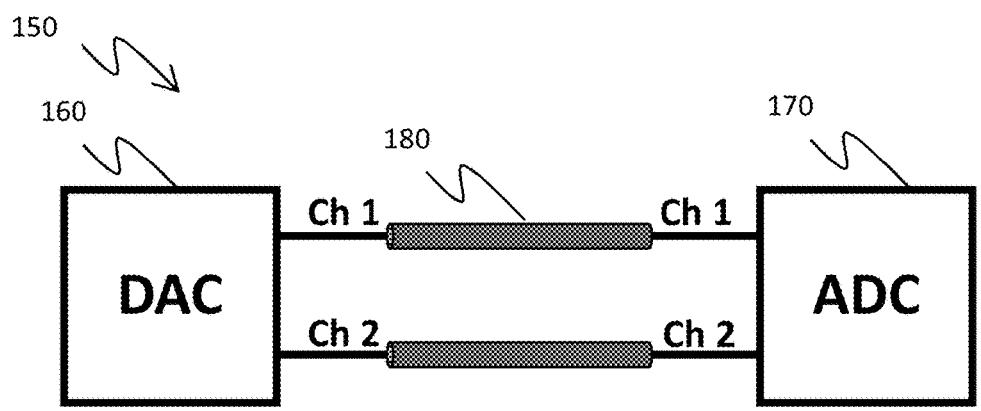

FIGS. 1A and 1B show two example prior art systems that use multichannel DACs and ADCs, which can suffer from crosstalk. FIG. 1A is a two-channel wireless system 100 (e.g., an RF communication system), which uses a two-channel DAC 110 in the transmitter to convert two digital signals (one for each channel) to two analog signals for transmission over two wireless channels using antennas 130. The signals for the two channels are received by the receiving antennas 140 and then converted into digital information using the ADC 120 in the receiver.

FIG. 1B is a two-channel wired system 150 (e.g., an optical communication system, or an electrical communication system), which uses a two-channel DAC 160 in the transmitter to convert two digital signals (one for each channel) to two analog signals for transmission over two wired channels 180 (e.g., fiber-optic transmission channels, or electrical wires). The signals for the two channels are received by the receiver and then converted into digital information using the ADC 170 in the receiver.

Figure 2:
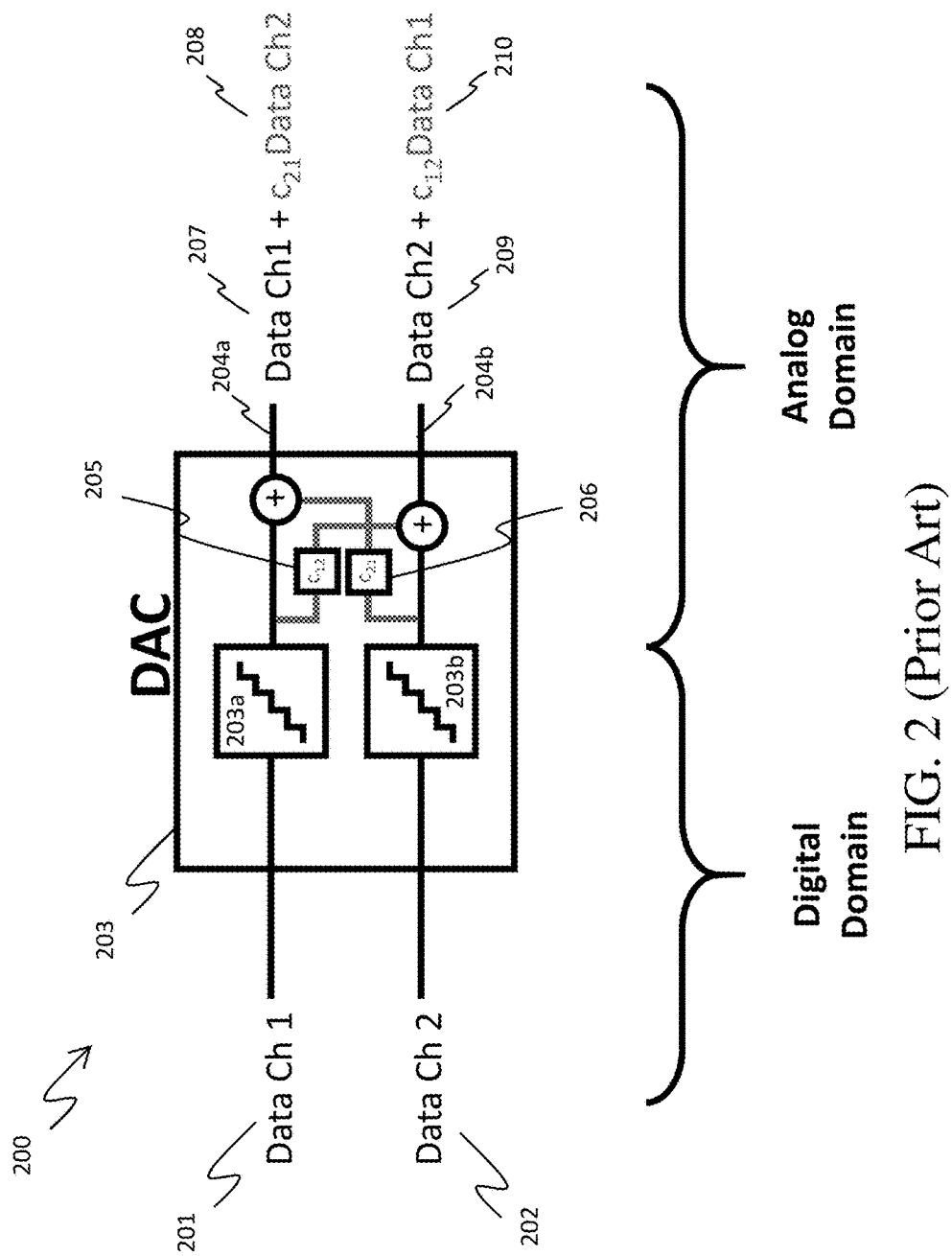
FIG. 2 is a simplified schematic diagram of a prior art multichannel digital-to-analog converter (DAC).

FIG. 2 is a simplified schematic diagram of a prior art multichannel digital-to-analog converter (DAC) 203 of a system 200. Some elements are omitted for ease of illustration and explanation. The system in FIG. 2 is one non-limiting example of a DAC in a system that can suffer from crosstalk, such as the wireless and wired systems 100 and 150 shown in FIGS. 1A and 1B. In other embodiments, different types of systems with different system elements can suffer from crosstalk, and the crosstalk in those systems can also be corrected or mitigated using the systems and methods described herein.

As shown, the multichannel DAC 203 includes two DACs 203a-b. The DAC 203a receives a first digital representation 201 of a first desired analog signal at a digital input. In some embodiments, the first desired analog signal represents an in-phase component, Data1 (desired channel 1 signal "Data Ch1" 207), of an in-phase and quadrature (IQ) represented signal (e.g., a quadrature-amplitude modulation (QAM) signal). The DAC 203a converts the first digital representation 201 into a first analog signal 204a. Likewise, the DAC 203b receives a second digital representation 202 of a second analog signal at a digital input. In some embodiments, the second analog signal represents a quadrature component, DataQ (desired channel 2 signal "Data Ch2" 209), of the IQ represented signal. The DAC 203b converts the second digital representation 202 into a second analog signal 204b.

Due to effects of close spacing within the circuitry/packaging of the multichannel DAC 203, or due to other effects, crosstalk 205 and crosstalk 206 are present between the analog ports of the DACs 203a-b. Although the system 200 includes two DACs 203a-b in the multichannel DAC 203, other types of multichannel systems (e.g., multiple input and multiple output (MIMO) systems, with multiple input ports and multiple output ports) can also suffer from crosstalk between the channels. For example, one channel in a MIMO system can affect adjacent channels, many other channels, or all of the other channels. Additionally, the amount of crosstalk in MIMO systems can be described by a matrix in which every channel has a different impact (greater or lesser) on the other channels. Furthermore, the amount of crosstalk in systems can be described by a multidimensional matrix, in which combinations of channels affect combinations of other channels. Additionally, in any of the MIMO embodiments described above, the crosstalk interactions can be instantaneous or include memory effects or intersymbol interference (ISI).

The first analog signal 204a includes the desired channel 1 signal "Data Ch1" 207, but due to crosstalk 206 it also includes a portion ($c_{21}$ Data Ch2) 208 of the channel 2 signal "Data Ch2" 209. The degree to which Data Ch2 209 is present in the first analog signal 204a depends on a first coupling coefficient $c_{21}$ that represents the crosstalk strength from the second DAC 203b to the first DAC 203a.

Likewise, the second analog signal 204b includes the Data Ch2 signal 209, but due to crosstalk 205 it also includes a portion ($c_{12}$ Data Ch2) 210 of the Data Ch1 signal 207. The degree to which Data Ch1 signal 207 is present in the second analog signal 204b depends on a second coupling coefficient $c_{12}$ that represents the crosstalk strength from the first DAC 203a to the second DAC 203b.

Figure 3:
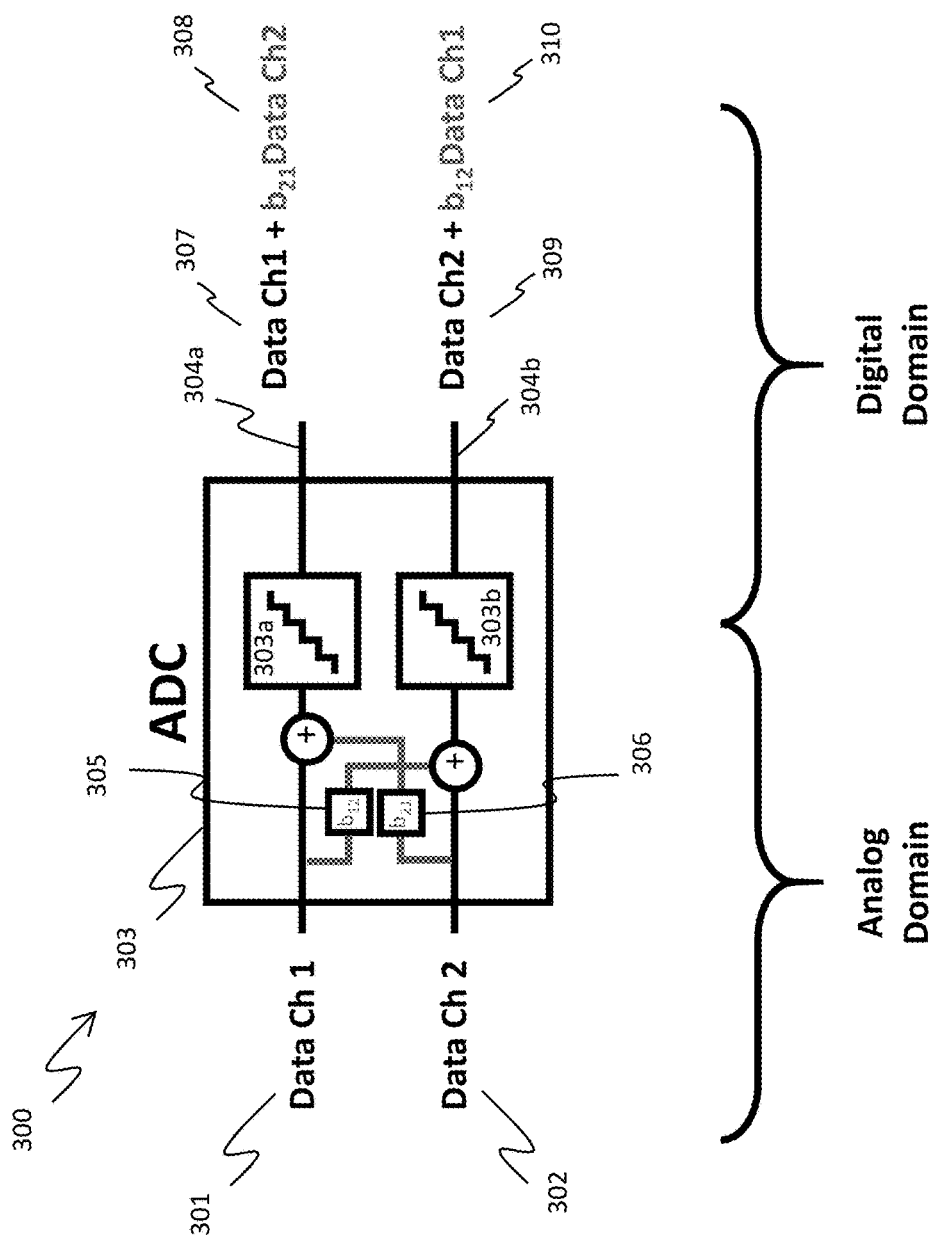
FIG. 3 is a simplified schematic diagram of a prior art multichannel analog-to-digital converter (ADC).

FIG. 3 is a simplified schematic diagram of a prior art multichannel analog-to-digital converter (ADC) 303 of a system 300. Some elements are omitted for ease of illustration and explanation. The system in FIG. 3 is one non-limiting example of an ADC in a system that can suffer from crosstalk, such as the wireless and wired systems 100 and 150 shown in FIGS. 1A and 1B. In other embodiments, different types of systems with different system elements can suffer from crosstalk, and the crosstalk in those systems can also be corrected or mitigated using the systems and methods described herein.

As shown, the multichannel ADC 303 includes two ADCs 303a-b. The ADC 303a receives a first analog signal 301 of a first desired digital representation at an analog input. In some embodiments, the first desired analog signal represents an in-phase component, Data1 (desired channel 1 signal "Data Ch1" 307), of an in-phase and quadrature (IQ) signal (e.g., a quadrature-amplitude modulation (QAM) signal). The ADC 303a converts the first analog signal 301 into a first digital representation 304a. Likewise, the ADC 303b receives a second analog signal 302 of a second desired digital representation at an analog input. In some embodiments, the second analog signal represents a quadrature component, DataQ (desired channel 2 signal "Data Ch2" 309), of the IQ represented signal. The ADC 303b converts the second analog signal 302 into a second digital representation 304b.

Due to effects of close spacing within the circuitry/packaging of the multichannel ADC 303, or due to other effects, crosstalk 305 and crosstalk 306 are present between the analog ports of the ADCs 303a-b. Although the system 300 shown in FIG. 3 includes two ADCs 303a-b in the multichannel ADC 303, other types of multichannel systems (e.g., multiple input and multiple output (MIMO) systems, with multiple input ports and multiple output ports) can also suffer from crosstalk between the channels. For example, one channel in a MIMO system can affect adjacent channels, many other channels, or all of the other channels. Additionally, the amount of crosstalk in MIMO systems can be described by a matrix in which every channel has a different impact (greater or lesser) on the other channels. Furthermore, the amount of crosstalk in MIMO systems can be described by a multidimensional matrix, in which combinations of channels affect combinations of other channels. Additionally, in any of the MIMO embodiments described above, the crosstalk interactions can be instantaneous or include memory effects or intersymbol interference (ISI).

The first digital representation 304a includes the desired channel 1 representation "Data Ch1" 307, but due to crosstalk 306 it also includes a portion ($b_{21}$ Data Ch2) 308 of the channel 2 representation "Data Ch2" 309. The degree to which Data Ch2 309 is present in the first digital representation 304a depends on a first coupling coefficient $b_{21}$ that represents the crosstalk strength from the second ADC 303b to the first ADC 303a.

Likewise, the second digital representation 304b includes the Data Ch2 digital representation 309, but due to crosstalk 305 it also includes a portion ($b_{12}$Data Ch1) 310 of the Data Ch1 digital representation 307. The degree to which Data Ch1 digital representation 307 is present in the second digital signal 304b depends on a second coupling coefficient $b_{12}$ that represents the crosstalk strength from the first ADC 303a to the second ADC 303b.

In some embodiments, the crosstalk between channels in a communication system containing a DAC and/or ADC is caused by crosstalk between digitizers in a multichannel DAC and/or ADC (as shown in FIGS. 2 and 3). In other embodiments, the crosstalk between channels in a communication system containing a DAC and/or ADC is caused by crosstalk between channels in components other than the DAC and ADC. For example, in some cases the crosstalk between channels in a communication system containing a DAC and/or ADC is caused by crosstalk between the channels of the electrical couplings (e.g., wires) connecting the different channels of a multichannel DAC and/or a multichannel ADC to the rest of the communication system. In another example, a DAC and/or ADC in a multichannel communication system is integrated with other components, which are used to input signals, output signals, modulate signals, and/or otherwise process signals before or after input or output from the multichannel DAC and/or multichannel ADC. Any component in such a multichannel communication system can suffer from crosstalk between the channels, and the methods and systems described herein can be used to correct (or, compensate for) the crosstalk caused by any component in the communication system.

Figure 4A:
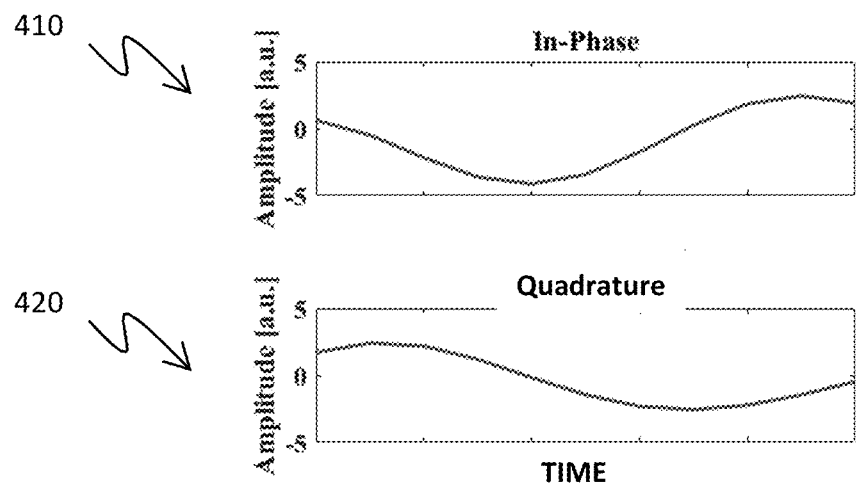
FIG. 4A shows simplified graphs of in-phase and quadrature analog outputs of a multichannel DAC that are unaffected by crosstalk.

FIG. 4A shows simplified graphs 410 and 420 of in-phase and quadrature analog outputs of a multichannel DAC that are unaffected by crosstalk. The solid line of graph 410 shows an excerpt of an ideal first analog output from a first DAC of the multichannel DAC. The ideal first analog output represents the in-phase component of a QAM modulated signal. The solid line of graph 420 shows an excerpt of an ideal second analog output from a second DAC of the multichannel DAC. The ideal second analog output represents the quadrature component of the QAM modulated signal. In this example, graph 410 and graph 420 both depict ideal conversions from digital representations to their respective analog signals. That is, neither analog output is affected by crosstalk.

Figure 4B:
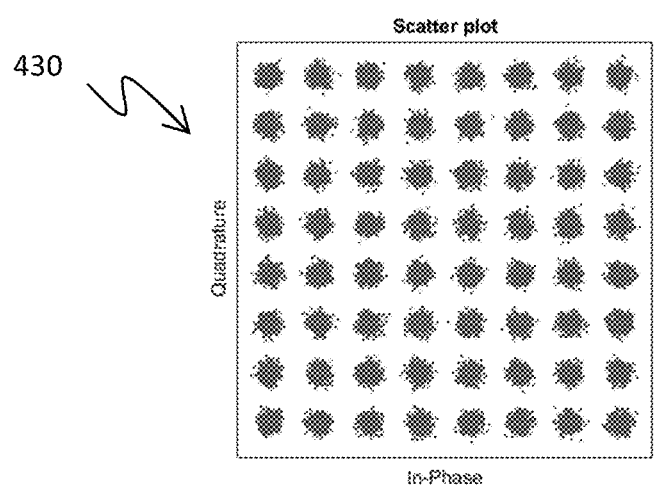
FIG. 4B shows a simplified constellation diagram that is unaffected by crosstalk.

FIG. 4B shows a simplified constellation diagram 430 that is unaffected by crosstalk. A constellation diagram is a two-dimensional scatter plot, in the X-Y plane, that represents a signal which has been modulated using modulation techniques such as phase-shift keying (PSK) or quadrature-amplitude modulation (QAM). In the example shown, the simplified constellation diagram 430 corresponds to a QAM modulated signal (64-QAM). The x-axis of the constellation diagram corresponds to the in-phase component of the QAM modulated signal (e.g., as shown in graph 410), and the y-axis of the constellation diagram corresponds to the quadrature component of the QAM modulated signal (e.g., as shown in graph 420). The constellation points of a constellation diagram are often arranged in a square grid with equal vertical and horizontal spacing. As constellation points become closer together, the communication system becomes more susceptible to noise and other impairments.

Figure 4C:
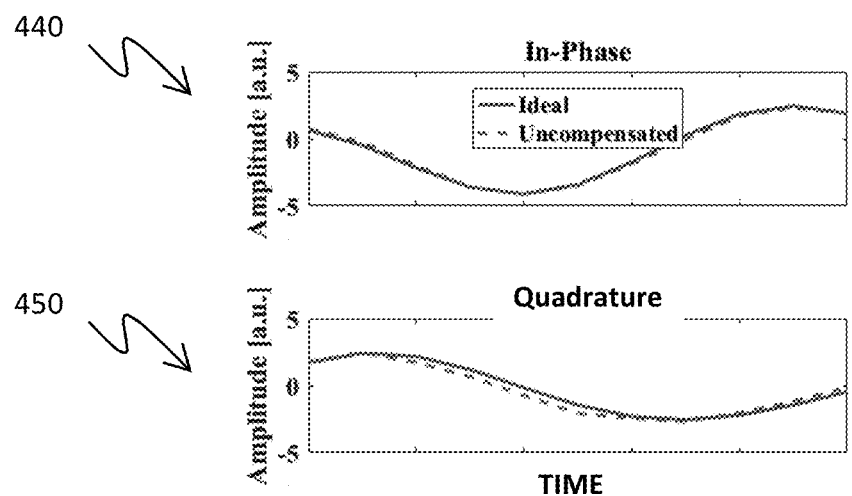
FIG. 4C shows simplified graphs of in-phase and quadrature analog outputs of a multichannel DAC before crosstalk-correction.

FIG. 4C shows simplified graphs 440 and 450 of in-phase and quadrature analog outputs of a multichannel DAC (e.g., the multichannel DAC 203) before or without crosstalk-correction. The dashed line of graph 440 shows an excerpt of an uncorrected first analog output from a first DAC (e.g., DAC 203a) of the multichannel DAC that is affected by crosstalk that is 10 dB lower than the desired signal. The uncorrected first analog output represents the in-phase component of a signal (e.g., Data1; or Data Ch1 207) plus a portion of crosstalk (e.g., the portion 208). Similarly, the dashed line of graph 450 shows an excerpt of an uncorrected second analog output from a second DAC (e.g., DAC 203b) of the multichannel DAC that is affected by crosstalk. The uncorrected second analog output represents the quadrature component of the signal (e.g., DataQ, or Data Ch2 209) plus a portion of crosstalk (e.g., the portion 210).

While the uncorrected first analog output shown in graph 440 does not diverge significantly from an ideal first analog output (shown as a solid line in graph 440), the uncorrected second analog output shown in graph 450 does diverge slightly from an ideal second analog output (shown as a solid line in graph 450).

Figure 4D:
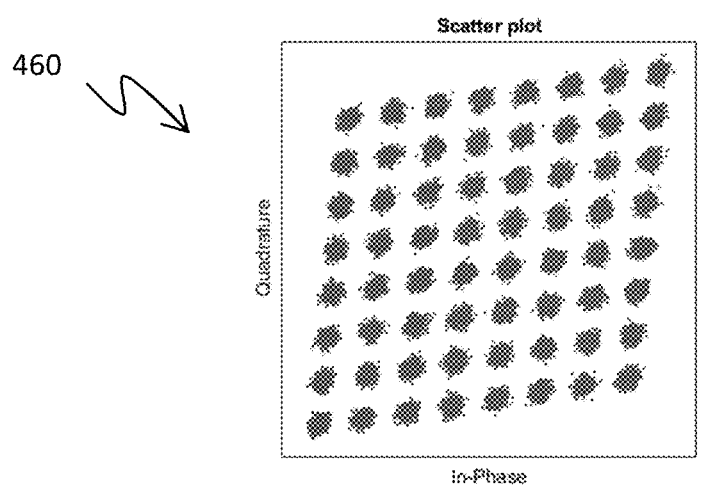
FIG. 4D shows a simplified constellation diagram before crosstalk-correction.

FIG. 4D shows a simplified constellation diagram 460 that is affected by crosstalk. As shown, even a slight amount of crosstalk (shown in graph 450) introduces significant warping of the constellation diagram. This results in a significant departure from a square shape of the constellation diagram 460. Because of this warping, the constellation points are no longer arranged with equal vertical and horizontal spacing. As was discussed with respect to FIG. 4B, the communication system will thus be more susceptible to noise and other impairments.

Figure 5A:
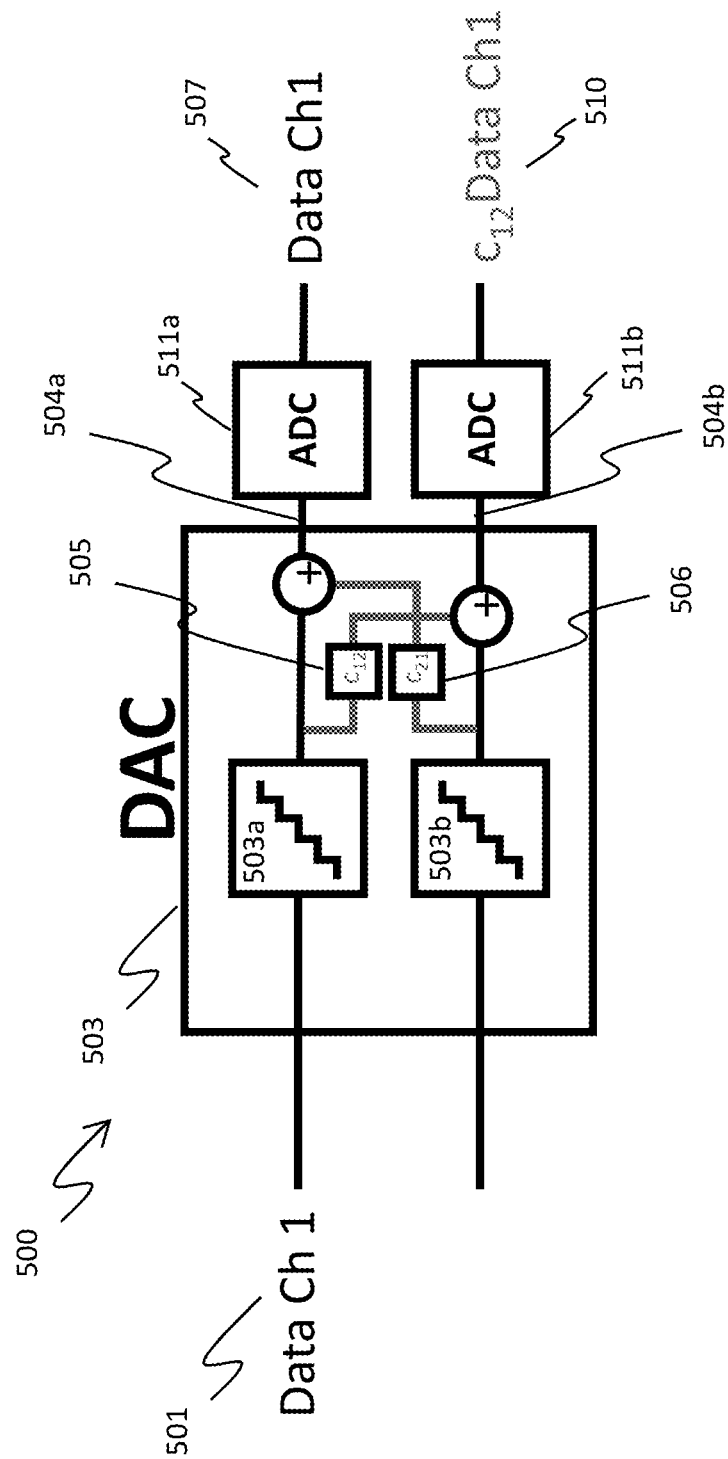
FIGS. 5A and 5B show a simplified schematic diagram of a system used to determine the coupling coefficients of a DAC, in accordance with some embodiments.
Figure 5B:
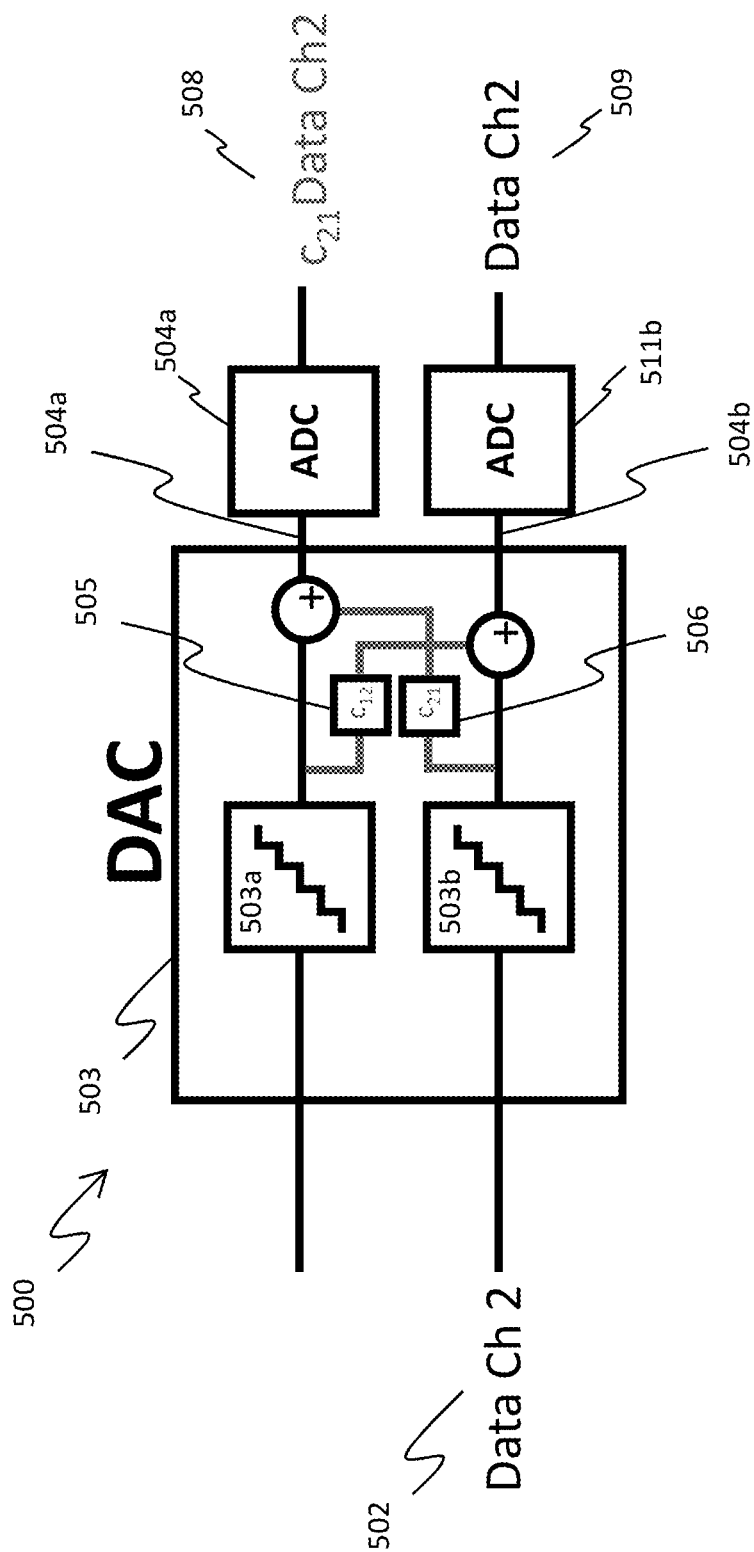

FIGS. 5A and 5B are simplified schematic diagrams of a multichannel DAC 503 with crosstalk between channels 1 and 2. The DAC 503 in FIGS. 5A and 5B is similar to the DAC 203 in system 200 described in FIG. 2. In some embodiments, the systems 500 shown in FIGS. 5A and 5B are used to determine the coupling coefficients (e.g., $c_{12}$ and $c_{21}$) that represents the crosstalk strength between the individual DACs 503a-b within the multichannel DAC 503.

FIG. 5A shows that a digital representation of an analog signal Data Ch1 501 is the input of the first channel of the multichannel DAC 503. The multichannel DAC 503 produces two analog signals 504a-b, one of which is the input of an ADC 511a and one of which is the input of an ADC 511b. The two ADCs 511a-b in system 500 each have no crosstalk. In some cases, the ADCs 511a-b are single channel ADCs with no crosstalk. In other cases, the ADCs 511a-b are multichannel ADCs whose crosstalk has been characterized and corrected for within blocks 511a-b. Since the first channel of the multichannel DAC 503 has an input Data Ch1, and the second channel of the multichannel DAC 503 has no input signal, the analog output of the first channel 504a of the multichannel DAC 503 contains only information from channel 1. And in this case, due to the crosstalk in the multichannel DAC 503, the analog output of the second channel 504b of the multichannel DAC 503 also contains information from channel 1, and it is scaled by the coupling coefficient $c_{12}$. The generated analog signals 504a-b are then converted to digital representations of the generated analog signals using the ADCs 511a-b. Since the ADCs 511a-b do not have any crosstalk, the digital representation at the output (Data Ch1) of the first channel 507 contains information from Data Ch1 only. And in this case, the digital representation at the output ($c_{12}$Data Ch1) of the second channel 510 contains information from Data Ch1 scaled by the coupling coefficient $c_{12}$. The coupling coefficient $c_{12}$ can, thus, be determined from this configuration in FIG. 5A.

The other coupling coefficient $c_{21}$, can be determined using the same system 500, as shown in FIG. 5B. In this case a digital representation of an analog signal Data Ch2 502 is the input of the second channel of the multichannel DAC 503. Since the second channel of the multichannel DAC 503 has an input Data Ch2, and the first channel of the multichannel DAC 503 has no input signal, the analog output of the second channel 504b of the multichannel DAC 503 contains only information from channel 2. And in this case, due to the crosstalk in the multichannel DAC 503, the analog output of the first channel 504a of DAC 503 also contains information from channel 2, and it is scaled by the coupling coefficient $c_{21}$. The generated analog signals 504a-b are then converted to digital representations of the generated analog signals using the ADCs 511a-b. Since the ADCs 511a-b do not have any crosstalk, the digital representation at the output (Data Ch2) of the second channel 509 contains information from Data Ch2 only. And in this case, the digital representation at the output ($c_{21}$Data Ch2) of the first channel 508 contains information from Data Ch2 scaled by the coupling coefficient $c_{21}$.

As shown in FIGS. 5A and 5B, the system 500 can be used to determine both coupling coefficients $c_{12}$ and $c_{21}$. These systems can be used to perform an initial characterization of the coupling coefficients $c_{12}$ and $c_{21}$ in the multichannel DAC 503 (DACs 503a-b) before it is installed into a communication system. For example, the initial characterization of the coupling coefficients $c_{12}$ and $c_{21}$ in the multichannel DAC 503 can occur in the factory before shipping to a customer. Alternatively, the initial characterization of the coupling coefficients $c_{12}$ and $c_{21}$ in the multichannel DAC 503 can be performed in bench top experiments before being deployed in a communication system. In some embodiments, the system 500 is installed as a portion of a communications system, and the characterization of the coupling coefficients $c_{12}$ and $c_{21}$ in the multichannel DAC 503 is performed periodically during normal operation. In some cases, the system 500 is installed as a portion of a communications system, and the system is periodically taken offline (i.e., normal operation is suspended) to characterize, recharacterize, revise or update the coupling coefficients $c_{12}$ and $c_{21}$ in the multichannel DAC 503.

Figure 6A:
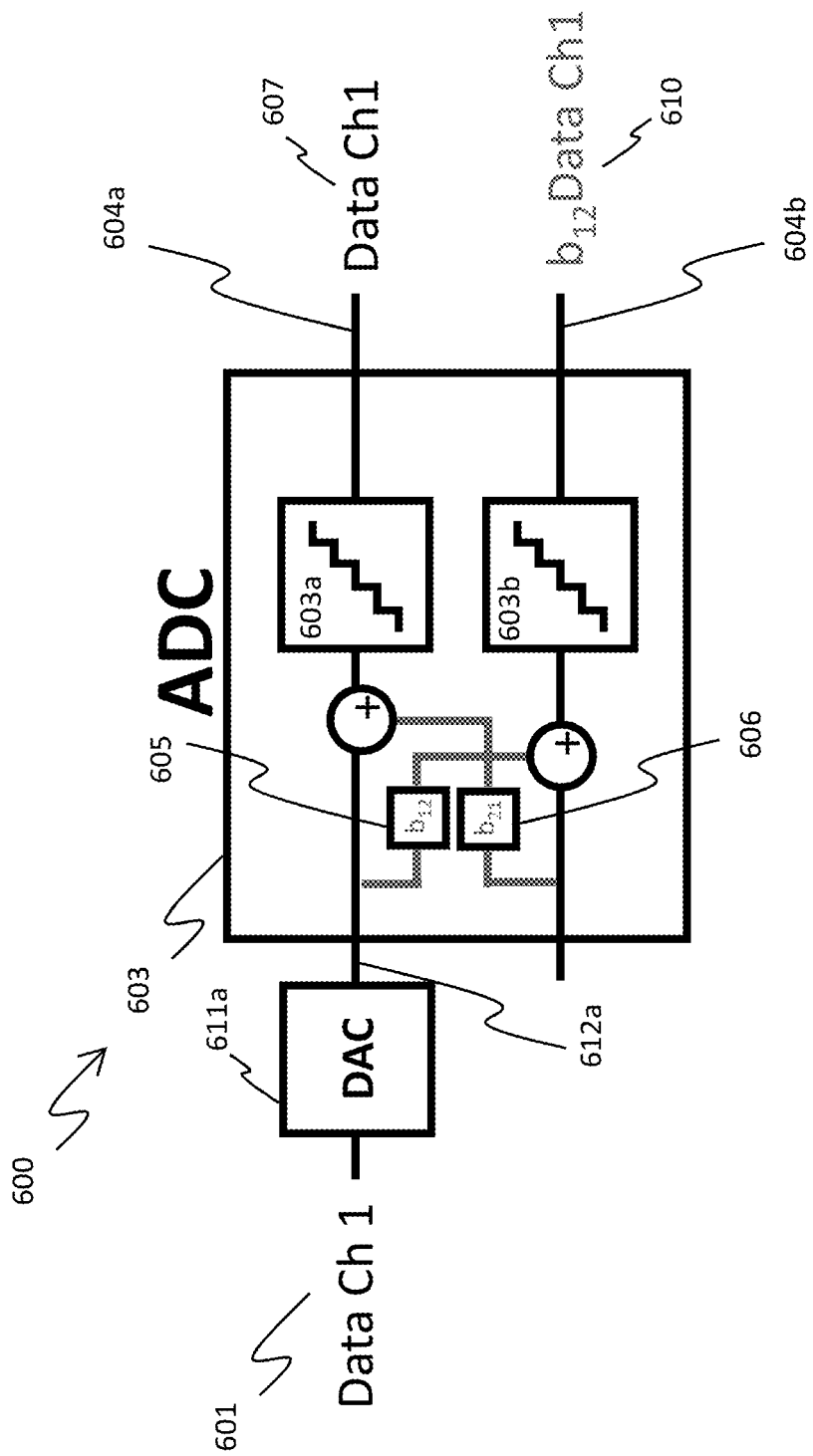
FIGS. 6A and 6B show a simplified schematic diagram of a system used to determine the coupling coefficients of an ADC, in accordance with some embodiments.
Figure 6B:
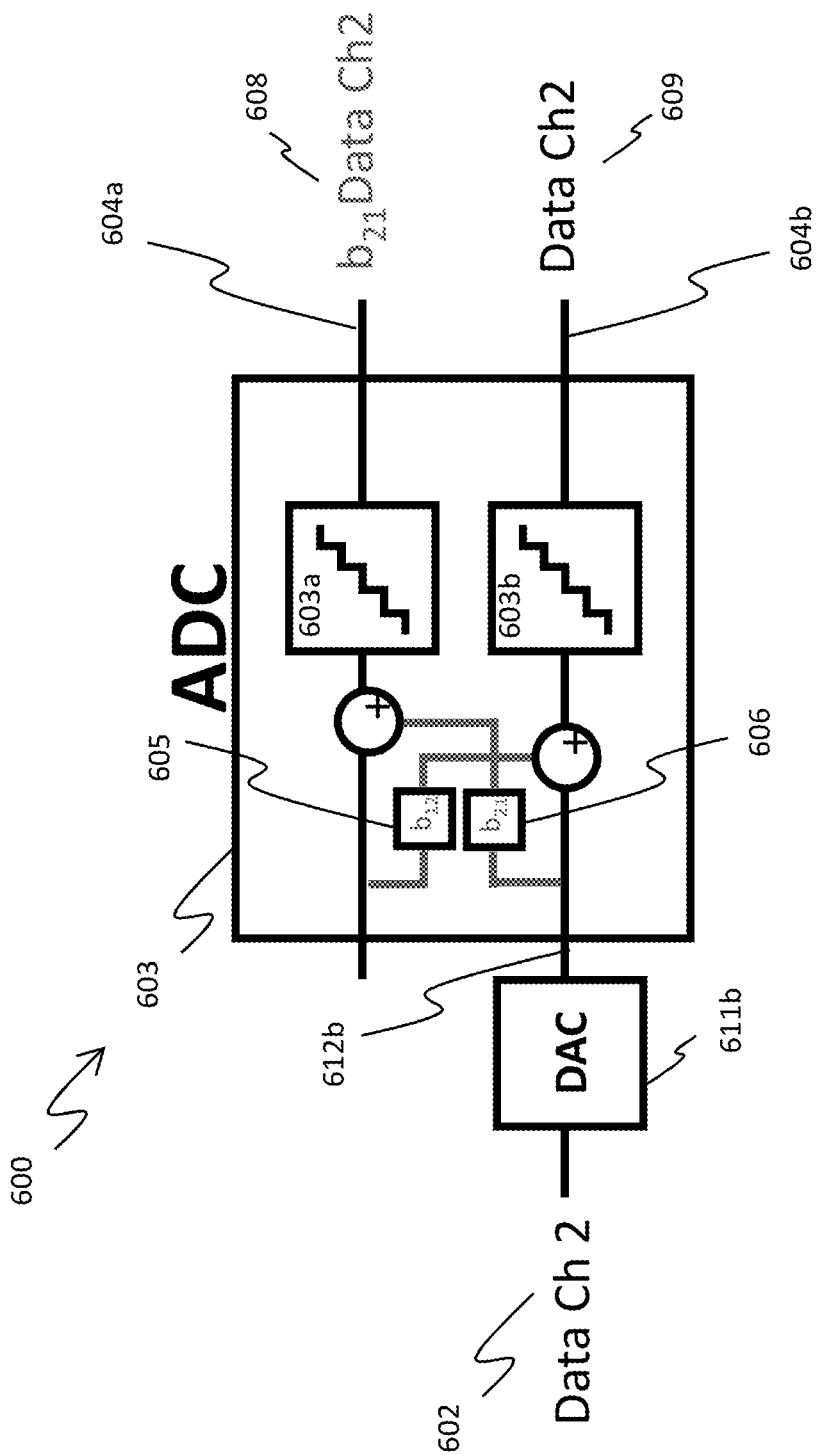

FIGS. 6A and 6B are simplified schematic diagrams of a multichannel ADC 603 with crosstalk between channels 1 and 2 in a system 600. The ADC 603 in FIGS. 6A and 6B is similar to the ADC 303 in system 300 described in FIG. 3. In some embodiments, the systems 600 shown in FIGS. 6A and 6B are used to determine the coupling coefficients (e.g., $b_{12}$ and $b_{21}$) that represents the crosstalk strength between the individual ADCs 603a-b within the multichannel ADC 603.

FIG. 6A shows that a digital representation of an analog signal Data Ch1 601 is converted to a generated analog signal 612a using a DAC 611a. The DAC 611a in the system 600 has no effective crosstalk. In some cases, the DAC 611a is a single channel DAC with no crosstalk. In other cases, the DAC 611a is a multichannel DAC whose crosstalk has been characterized and corrected for within block 611a. The generated analog signal 612a is the input of the first channel of the multichannel ADC 603. The multichannel ADC 603 produces two digital representations of analog signals 604a-b. Since the first channel of the multichannel ADC 603 has an input containing the information of Data Ch1, and the second channel of the multichannel ADC 603 has no input signal, the digital output of the first channel 604a of the multichannel ADC 603 contains only information from channel 1. And in this case, due to the crosstalk in the multichannel ADC 603, the digital output of the second channel 604b of the multichannel ADC 603 also contains information from channel 1, and it is scaled by the coupling coefficient $b_{12}$. In this case, the output of the first channel 607 contains information from Data Ch1 only. And in this case, the digital representation at the output ($b_{12}$Data Ch1) of the second channel 610 contains information from Data Ch1 scaled by the coupling coefficient $b_{12}$. The coupling coefficient $b_{12}$ can, thus, be determined from this configuration in FIG. 6A.

The other coupling coefficient $b_{21}$, can be determined using the same system 600, as shown in FIG. 6B. In this case a digital representation of an analog signal Data Ch2 602 is converted to a generated analog signal 612b using a DAC 611b. Since the second channel of the multichannel ADC 603 has an input Data Ch2, and the first channel of the multichannel ADC 603 has no input signal, the digital output of the second channel 604b of the multichannel ADC 603 contains only information from channel 2. And in this case, due to the crosstalk in the multichannel ADC 603, the digital output ($b_{21}$ Data Ch2) of the first channel 604a of ADC 603 also contains information from channel 2, and it is scaled by the coupling coefficient $b_{21}$. In this case, the digital representation at the output of the second channel 609 contains information from Data Ch2 only. And in this case, the digital representation at the output ($b_{21}$ Data Ch2) of the first channel 608 contains information from Data Ch2 scaled by the coupling coefficient $b_{21}$.

As shown in FIGS. 6A and 6B, the system 600 can be used to determine both coupling coefficients $b_{12}$ and $b_{21}$. These systems can be used to perform an initial characterization of the coupling coefficients in the multichannel ADC 603 (the ADCs 603a-b) before they are installed into a communication system. For example, the initial characterization of the coupling coefficients in the multichannel ADC 603 can occur in the factory before shipping to a customer. Alternatively, the initial characterization of the coupling coefficients in the multichannel ADC 603 can be performed in bench top experiments before being deployed in a communication system. In some embodiments, the system 600 is installed as a portion of a communications system, and the characterization of the coupling coefficients $b_{12}$ and $b_{21}$ in the multichannel ADC 603 is performed periodically during normal operation. In some cases, the system 600 is installed as a portion of a communications system, and the system is periodically taken offline (i.e., normal operation is suspended) to characterize, recharacterize, revise or update the coupling coefficients $b_{12}$ and $b_{21}$ in the multichannel ADC 603.

Figure 7:
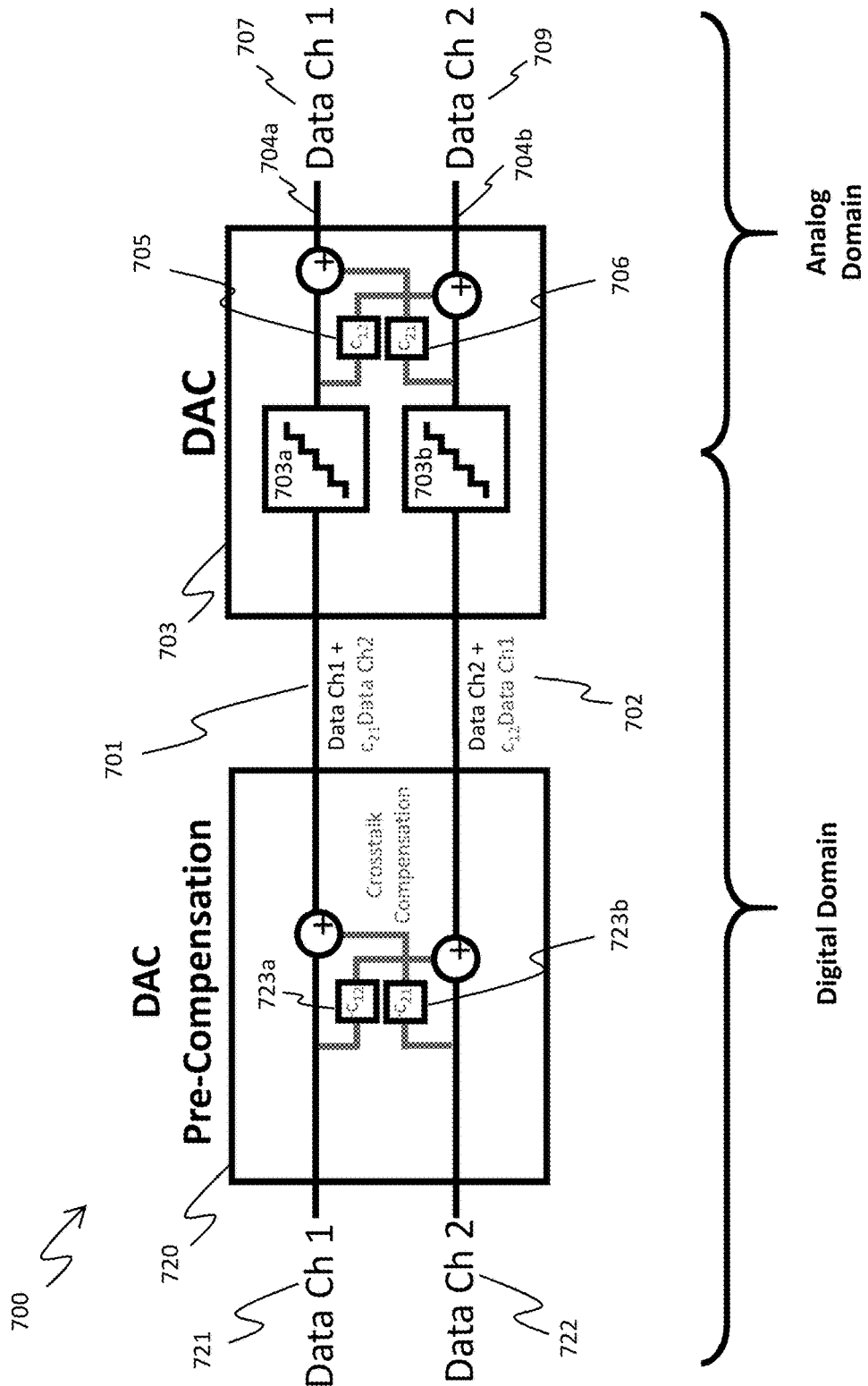
FIG. 7 shows a simplified schematic diagram of a system including a crosstalk pre-compensated DAC, in accordance with some embodiments.
Figure 8:
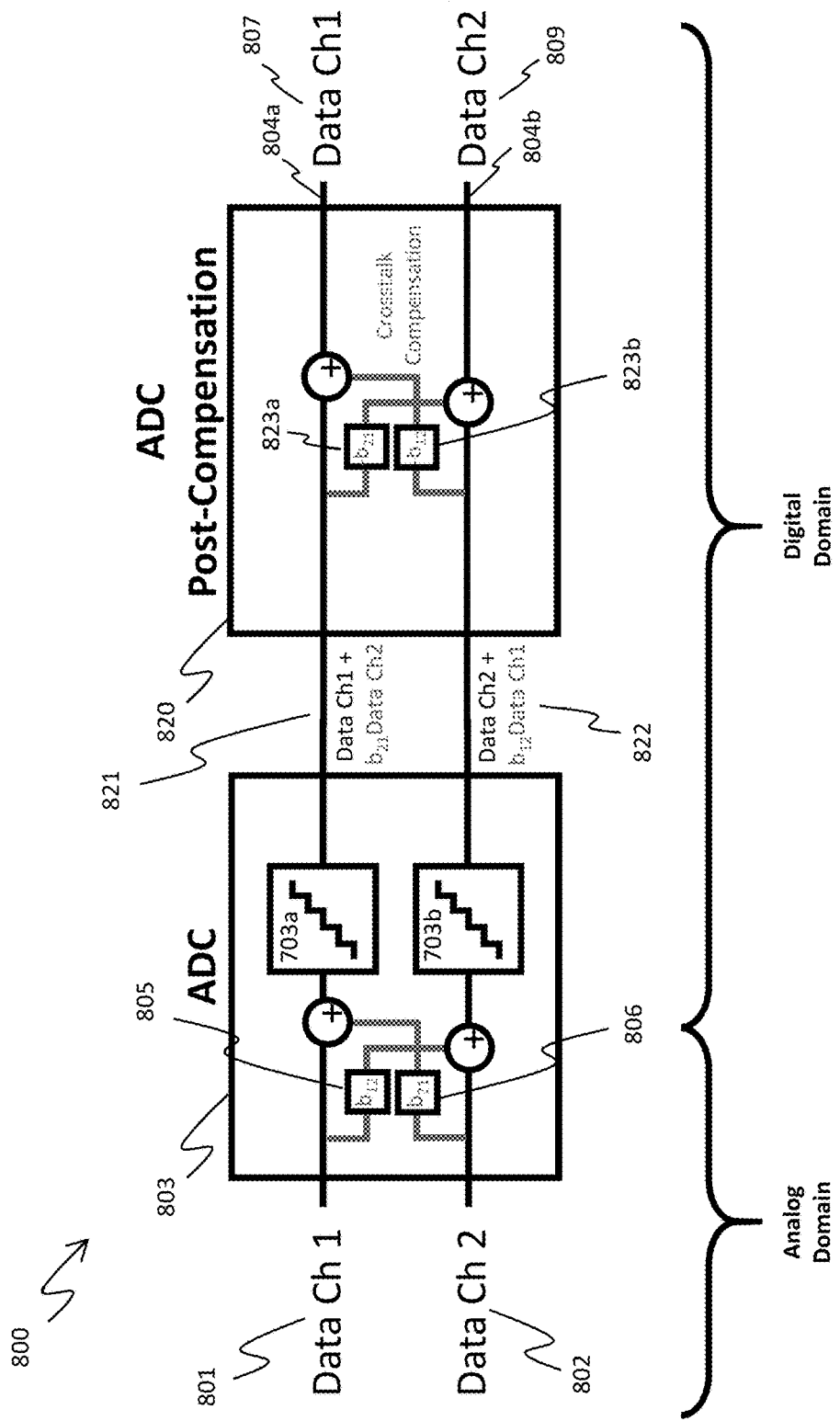
FIG. 8 shows a simplified schematic diagram of a system including a crosstalk post-compensated ADC, in accordance with some embodiments.

FIGS. 7 and 8 are simplified schematic diagrams of systems that compensate for the crosstalk in DACs and ADCs, respectively, using determined coupling coefficients. FIGS. 7 and 8 show the compensation occurring in the digital domain, which is accomplished as pre-compensation for crosstalk in a multichannel DAC, and post-compensation for crosstalk in a multichannel ADC.

FIG. 7 shows an example system 700 with pre-compensation of a multichannel DAC 703. The DAC 703 has two channels with crosstalk defined by coupling coefficients $c_{12}$ and $c_{21}$ 705 and 706, as described above, in this example, the inputs 701 and 702 of the DAC 703 are modified by a multichannel pre-compensator (DAC Pre-Compensation) 720 before entering the DAC 703. The inputs 721 and 722 of the pre-compensator 720 are the digital representations of analog signals (Data Ch1 and Data Ch2) to be converted by the DAC 703 into analog signals. Unlike the system in FIG. 2, the system in FIG. 7 includes the pre-compensator 720, which includes the inverse of the coupling coefficients between the two channels that are related to $c_{12}$ and $c_{21}$ 723a-b such that the pre-compensator converts the digital representation inputs 721 and 722 into pre-compensated digital representation inputs 701 and 702 of the DAC 703. The pre-compensated digital representation 701 is fed into the first channel of the DAC 703a, and includes the information from the signal Data Ch1 as well as information from Data Ch2 scaled by the coupling coefficient $c_{21}$. Similarly, the pre-compensated digital representation 702 is fed into the second channel of the DAC 703b, and includes the information from the signal Data Ch2 as well as information from Data Ch1 scaled by the coupling coefficient $c_{12}$. The pre-compensated signals 701 and 702 are then converted to analog outputs 704a and 704b by the DAC 703. Since the pre-compensator 720 employs the coupling coefficients of the DAC 703, the analog outputs 707 and 709 are digital representations substantially corresponding to the input analog signals 721 and 722 without crosstalk effects.

FIG. 8 shows an example system 800 with post-compensation of a multichannel ADC 803. The ADC 803 has two channels with crosstalk defined by coupling coefficients $b_{12}$ and $b_{21}$ 805 and 806, as described above. In this example, the outputs 821 and 822 of the ADC 803 are modified by a multichannel post-compensator (ADC post-compensation) 820 after the ADC 803. The inputs 801 and 802 of the ADC 803 are the analog signals (Data Ch1 and Data Ch2) to be converted by the ADC 803 into digital representations. Unlike the system in FIG. 3, the system in FIG. 8 includes the post-compensator 820, which includes coupling coefficients between the two channels that are related to $b_{12}$ and $b_{21}$ 823a-b such that the post-compensator converts the ADC outputs 821 and 822 into post-compensated outputs 804a-b. The analog signal 801 is converted into a digital representation 821 by the ADC 803, which includes the information from the analog signals Data Ch1 as well as information from Data Ch2 scaled by the coupling coefficient $b_{21}$ due to the crosstalk in the ADC 803. Similarly, the analog signal 802 is converted into a digital representation 822 by the ADC 803, which includes the information from the analog signal Data Ch2 as well as information from Data Ch1 scaled by the coupling coefficient $b_{12}$ due to the crosstalk in the ADC 803. The ADC output 821 is fed into the first channel of the post-compensator 820, and the ADC output 822 is fed into the second channel of the post-compensator 820. The post-compensator 820 employs the coupling coefficients 823a-b of the ADC 803, and converts the digital representations 821 and 822 into digital representations 804a-b, respectively. The digital representations 804a-b then substantially correspond to the input analog signals 801 and 802, respectively, without crosstalk effects.

The systems 700 and 800 in FIGS. 7 and 8 rely on determined coupling coefficients that accurately describe the crosstalk in the DAC or ADC. In some embodiments, the coupling coefficients can be determined using the systems 500 and 600 in FIGS. 5A, 5B, 6A and 6B. In some embodiments, the coupling coefficients can be determined using systems similar to 500 and/or 600 initially, or periodically during operation (e.g., if the systems 500 and/or 600 are installed in the operating system).

Figure 9:
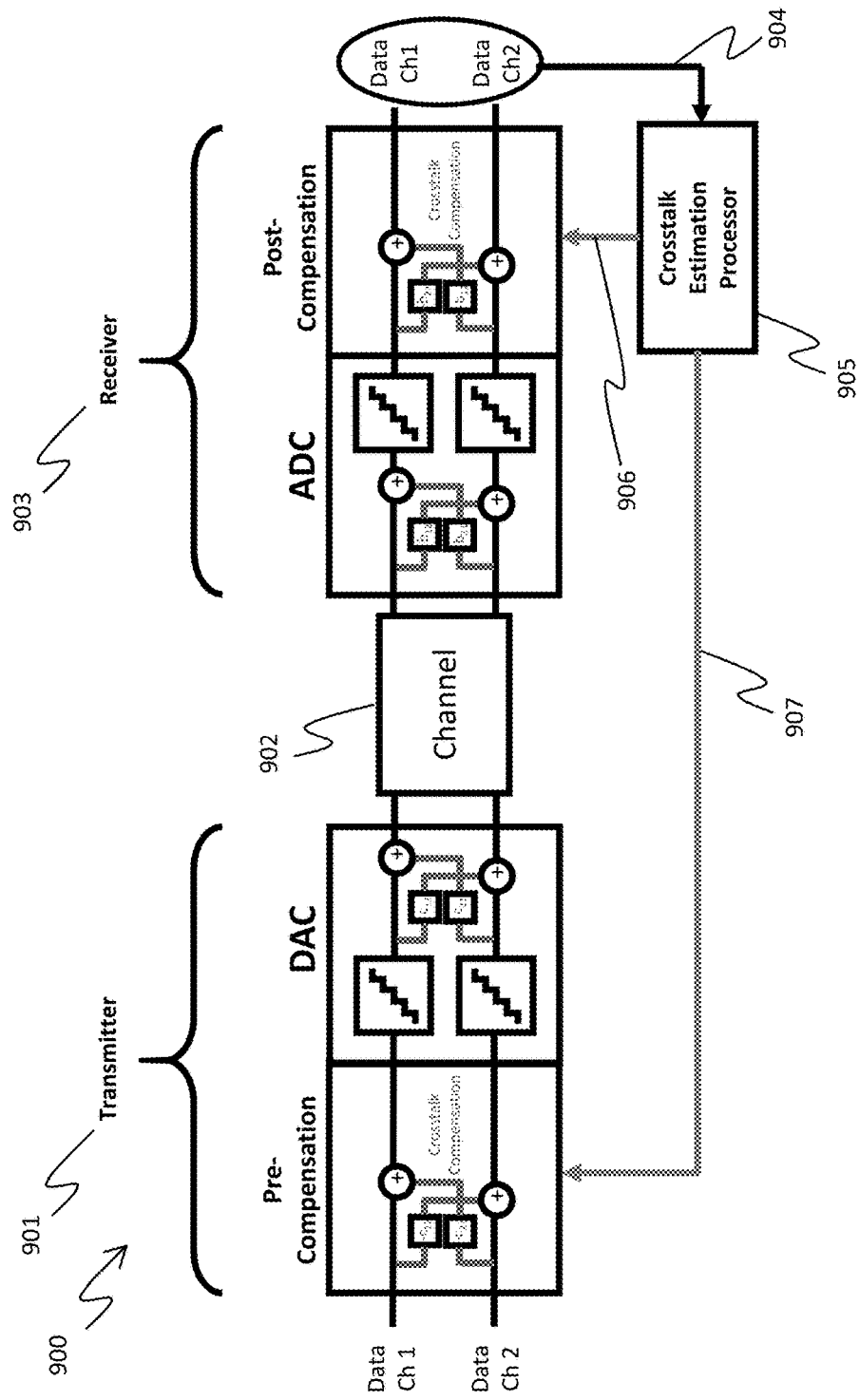
FIG. 9 shows a simplified schematic diagram of a communication system including a crosstalk pre-compensated DAC, a crosstalk post-compensated ADC, and a crosstalk estimation processor, in accordance with some embodiments.

FIG. 9 is a simplified schematic diagram of a communication system 900 with a DAC and pre-compensator in a transmitter 901, a channel 902 over which the signals are transmitted, and an ADC and post-compensator in a receiver 903. In this example, the transmitter 901 is similar to the system 700 described above, and the receiver 903 is similar to the system 800 described above. The pre-compensator and post-compensator in system 900 rely on coupling coefficients to compensate for crosstalk in the DAC and ADC as described above. In some embodiments, the coupling coefficients can be determined initially (e.g., using systems similar to 500 and/or 600), and the systems 500 and 600 are not installed in a communications system (e.g., system 900). In some embodiments, it is advantageous to correct the coupling coefficients periodically during operation. The system 900 is capable to updating the coupling coefficients in the pre-compensator and post-compensator using a crosstalk estimation processor 905. In this example, the crosstalk estimation processor 905 measures the output from the receiver 904 (i.e., Data Ch1 and Data Ch2 in FIG. 9), estimates the amount of crosstalk between the output channels of the receiver 903, and then adjusts the coupling coefficients in the post-compensation of the ADC in the receiver 906, and adjusts the coupling coefficients in the pre-compensation of the DAC in the transmitter 907.

In some embodiments, the crosstalk measured by the crosstalk estimation processor 905 is caused by crosstalk within the DAC and/or ADC as described above, or due to crosstalk within other components of the communication system 900. For example, the crosstalk can occur due to crosstalk between digitizers in a multichannel DAC and/or ADC, or due to crosstalk between the channels in electrical couplings (e.g., wires) between the DAC and/or ADC and the rest of the communication system 900, or due to crosstalk between the different channels within the channel 902 over which the signals are transmitted.

In some embodiments, system 900 initially begins with coupling coefficients that are determined (e.g., by systems similar to 500 and 600 in FIGS. 5A, 5B, 6A and 6B) and then corrects the coupling coefficients periodically as described above. In other embodiments, system 900 begins with estimates for the coupling coefficients, and then iteratively corrects the coupling coefficients. In some embodiments, the initial or periodic iterative correction of the coupling coefficients is performed using known or unknown signals and error minimizing algorithms. In some embodiments, the error minimizing algorithms use averages of the error over a number of transmitted and received signals.

Methods

Example embodiments directed to correcting (e.g., reducing, mitigating or eliminating) the effects of crosstalk in multichannel digitizer systems are discussed next.

Figure 10:
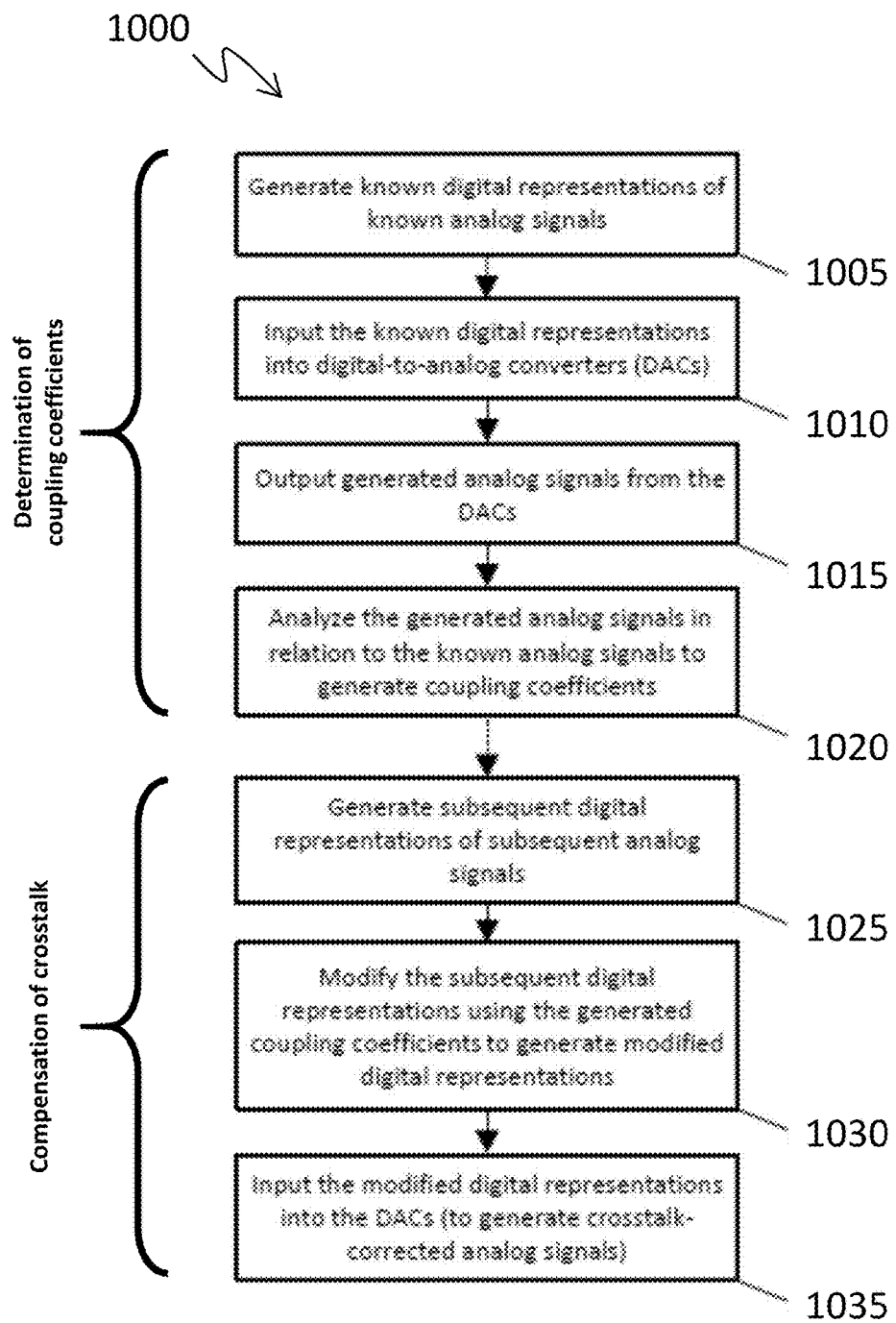
FIG. 10 provides an example process for crosstalk-correction for a multichannel DAC, in accordance with one or more example embodiments.

FIG. 10 provides an example process 1000 for estimating and using coupling coefficients for crosstalk-correction for a multichannel DAC, in accordance with one or more example embodiments. Steps 1005 through 1020 describe a method for determining the coupling coefficients for a DAC, and steps 1025 through 1035 describe a method for compensation of the crosstalk. At step 1005, known digital representations of known analog signals are generated. In some embodiments, this step includes generating a first known digital representation of a first known analog signal $X_1$, and generating a second known digital representation of a second known analog signal $X_2$. Next, at step 1010, the known digital representations are input into digital-to-analog converters (DACs). In some embodiments, this step includes inputting the first known digital representation into a first digital-to-analog converter (DAC), and inputting the second known digital representation into a second DAC. Then, at step 1015, generated analog signals are output from the DACs. In some embodiments, this step includes outputting a first generated analog signal $Y_1$ from the first DAC, and outputting a second generated analog signal $Y_2$ from the second DAC. At step 1020, the generated analog signals are analyzed in relation to the known analog signals to generate coupling coefficients that represent crosstalk strength. In some embodiments, this step includes analyzing $Y_1$ and $Y_2$ in relation to $X_1$ and $X_2$ to generate a first coupling coefficient $c_{12}$ (indicative of the crosstalk effect of the first DAC channel on the second DAC channel) and a second coupling coefficient $c_{21}$ (indicative of the crosstalk effect of the second DAC channel on the first DAC channel). In some embodiments, a system similar to the system 500 shown in FIGS. 5A and 5B can be used to analyze the crosstalk and determine the coupling coefficients as described above. In other embodiments, a system similar to system 900 in FIG. 9 can be used to analyze the crosstalk and determine the coupling coefficients as described above. In some embodiments, the multichannel DAC has more than two ports and the crosstalk can occur from non-adjacent channels, meaning that more than two coupling coefficients are needed to describe the system.

In some embodiments, the coupling coefficients $c_{12}$ and $c_{21}$ can be determined using signals that are not known. For example, the signals in steps 1005-1020 in the method described above could be any signals, including unknown signals, and the coupling coefficients $c_{12}$ and $c_{21}$ can still be determined. To illustrate a non-limiting example of this, refer to the system 500 in FIGS. 5A and 5B. This system 500 can be used to determine the coupling coefficients $c_{12}$ and $c_{21}$ using unknown input signals by using a ratio of the outputs of the ADCs 511*a-b*. By taking a ratio of these outputs, the signal (e.g., Data Ch1 or Data Ch2) will cancel out, and the coupling coefficients $c_{12}$ and $c_{21}$ can be determined without knowing what the input signals are.

In some embodiments, many generated analog signals of known (or unknown) digital representations are analyzed in relation to the known analog signals to generate coupling coefficients that represent crosstalk strength (e.g., in step 1020 in FIG. 10). In some cases, the number of analog signals analyzed is greater than the number of coupling coefficients, and the system is "over-determined." In some cases, the analysis of such an over-determined system can lead to determination of the coupling coefficients with a greater degree of accuracy.

As was discussed with respect to FIG. 2, due to the presence of crosstalk, $Y_1$ is not equal to $X_1$, and $Y_2$ is not equal to $X_2$. Rather, these signals relate as:

$$Y_1 = X_1 + c_{21} \times X_2 \quad \text{(Equation 1)}$$

and $$Y_2 = X_2 + c_{12} \times X_1. \quad \text{(Equation 2)}$$

At step 1025, subsequent digital representations of subsequent analog signals are generated. In some embodiments, step 1025 includes generating a first subsequent digital representation $Z_1$ of a first subsequent analog signal, and generating a second subsequent digital representation $Z_2$ of a second subsequent analog signal. The first and second subsequent analog signals are the analog signals that it is desired for the DACs to produce during operation thereof. In some embodiments, step 1025 occurs directly after step 1020. In some embodiments, step 1025 occurs substantially later after step 1020, as indicated by a dashed line connecting step 1020 to step 1025. In some embodiments, the coupling coefficients $c_{12}$ and $c_{21}$ are stored (e.g., in memory storage) after step 1020 and retrieved (e.g., from memory storage) before step 1025.

At step 1030, the subsequent digital representations are modified using the generated coupling coefficients to generate modified digital representations. In some embodiments, this step includes modifying $Z_1$ to generate a first modified digital representation $Z_{1\#}$ using $c_{12}$ and $c_{21}$, and modifying $Z_2$ to generate a modified digital representation $Z_{2\#}$ using $c_{12}$ and $c_{21}$.

In some embodiments, the modified digital representation $Z_{1\#}$ is generated using an equation of the form:

$$Z_{1\#} = \frac{Z_1 - c_{21} \times Z_2}{1 - c_{12} \times c_{21}}, \quad \text{(Equation 3)}$$

and the modified digital representation $Z_{2\#}$ is generated using an equation of the form:

$$Z_{2\#} = \frac{Z_2 - c_{12} \times Z_1}{1 - c_{12} \times c_{21}}, \quad \text{(Equation 4)}$$

wherein the denominator of both equations represents a scaling factor that can be omitted.

Then, at step 1035, the modified digital representations are input into different channels of the DAC (to generate crosstalk-corrected analog signals). In some embodiments, this step includes inputting $Z_{1\#}$ into the first DAC channel, and inputting $Z_{2\#}$ into the second DAC channel. The crosstalk-corrected analog signals representing $Z_1$ and $Z_2$ will now be present on the outputs of the multichannel DAC, to the extent that the coefficients $c_{12}$ and $c_{21}$ were accurately generated at step 1020. The crosstalk-corrected (i.e., modified) analog signals substantially match the desired first and second subsequent analog signals due to the corrections applied according to the coupling coefficients $c_{12}$ and $c_{21}$. In some embodiments, all or a portion of the steps of the process 1000 are carried out at a signal-processing device, a general-purpose processor, using circuitry, or at another device operable to carry out all or a portion of the steps.

A process performed using the steps of (or steps similar to) the process 1000, describes a pre-compensation embodiment wherein the signals are modified before the crosstalk occurs (i.e., before the signals are input into the DACs). In other embodiments, steps 1005, 1010, 415, and 1020 can be performed to estimate the coupling coefficients for a given system, and then the coupling coefficients can be used to post-compensate the affected signals after the crosstalk occurs (i.e., after the signals are output from the DACs).

Figure 11:
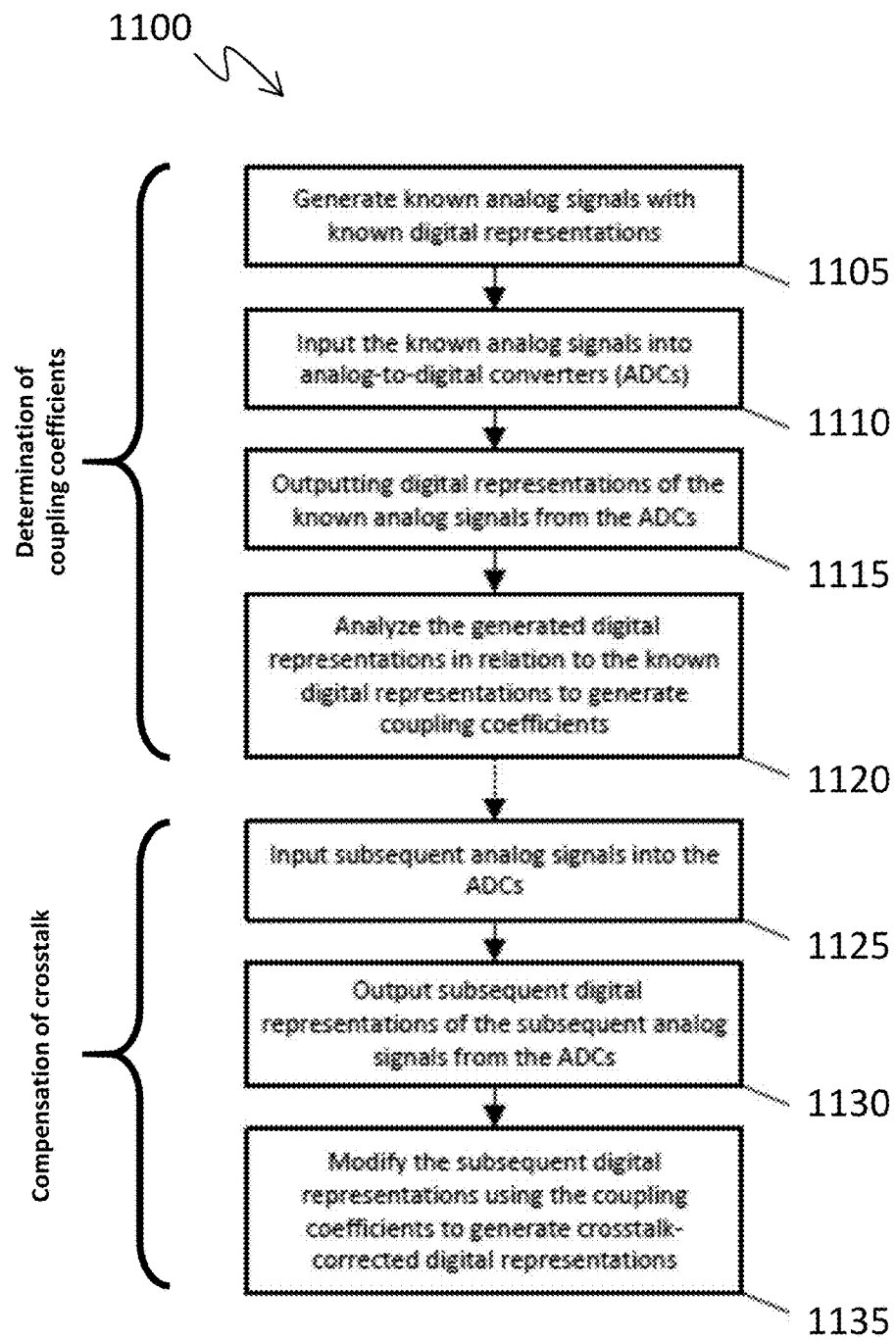
FIG. 11 provides an example process for crosstalk-correction for a multichannel ADC, in accordance with one or more example embodiments.

FIG. 11 provides an example process 1100 for estimating and using coupling coefficients for crosstalk-correction for a multichannel ADC, in accordance with one or more example embodiments. Steps 1105 through 1120 describe a method for determining the coupling coefficients for an ADC, and steps 1125 through 1135 describe a method for compensation of the crosstalk. At step 1105, known analog signals with known digital representations are generated. In some embodiments, this step includes generating a first known analog signal with a first known digital representation $A_1$, and generating a second known analog signal with a second known digital representation $A_2$. Next, at step 1110, the known analog signals are input into analog-to-digital converters (ADCs). In some embodiments, this step includes inputting the first known analog signal into a first analog-to-digital converter (ADC), and inputting the second known analog signal into a second ADC. Then, at step 1115, generated digital representations of the known analog signals are output from the ADCs. In some embodiments, this step includes outputting a first generated digital representation $B_1$ from the first ADC, and outputting a second generated digital representation $B_2$ from the second ADC. At step 1120, the generated digital representations are analyzed in relation to the known digital representations to generate coupling coefficients that represent crosstalk strength. In some embodiments, this step includes analyzing $B_1$ and $B_2$ in relation to $A_1$ and $A_2$ to generate a first coupling coefficient $b_{12}$ (indicative of the crosstalk effect of the first ADC channel on the second ADC channel) and a second coupling coefficient $b_{21}$ (indicative of the crosstalk effect of the second ADC channel on the first ADC channel). As was discussed with respect to FIG. 3, due to the presence of crosstalk, $B_1$ is not equal to $A_1$, and $B_2$ is not equal to $A_2$. In some embodiments, $B_1$ relates to $A_1$ in accordance with equation 1, and $B_2$ relates to $A_2$ in accordance with equation 2, wherein in both equations A is substituted for X and B is substituted for Y. In some embodiments, a system similar to the system 600 shown in FIGS. 6A and 6B can be used to analyze the crosstalk and determine the coupling coefficients as described above. In other embodiments, a system similar to system 900 in FIG. 9 can be used to analyze the crosstalk and determine the coupling coefficients as described above. In some embodiments, the multichannel ADC has more than two ports and more than two coupling coefficients are generated.

In some embodiments, the coupling coefficients $b_{12}$ and $b_{21}$ can be determined using signals that are not known. For example, the signals in steps 1105-1120 in the method described above could be any signals, including unknown signals, and the coupling coefficients $b_{12}$ and $b_{21}$ can still be determined. To illustrate a non-limiting example of this, refer to the system 600 in FIGS. 6A and 6B. This system 600 can be used to determine the coupling coefficients bit and $b_{21}$ using unknown input signals by using a ratio of the outputs of the ADCs 603a-b. By taking a ratio of these outputs, the signal (e.g., Data Ch1 or Data Ch2) will cancel out, and the coupling coefficients $b_{12}$ and $b_{21}$ can be determined without knowing what the input signals are.

In some embodiments, many digital representations of known (or unknown) analog signals are analyzed in relation to the known digital representations to generate coupling coefficients that represent crosstalk strength (e.g., in step 1120 in FIG. 11). In some cases, the number of digital representations analyzed is greater than the number of coupling coefficients, and the system is "over-determined." In some cases, the analysis of such an over-determined system can lead to determination of the coupling coefficients with a greater degree of accuracy.

At step 1125, subsequent analog signals are input into the ADCs. In some embodiments, step 1125 includes inputting a first subsequent analog signal into the first ADC, and inputting a second subsequent analog signal into the second ADC. In some embodiments, step 1125 occurs directly after step 1120. In some embodiments, step 1125 occurs substantially later after step 1120, as indicated by a dashed line connecting step 1120 to step 1125. In some embodiments, the coupling coefficients $c_{12}$ and $c_{21}$ are stored (e.g., in memory) after step 1120 and retrieved (e.g., from memory) before step 1125.

At step 1130, subsequent digital representations of the subsequent analog signals are output from the ADCs. In some embodiments, this step includes outputting a first generated digital representation $D_1$ from the first ADC, and outputting a second generated digital representation $D_2$ from the second ADC. Then, at step 1135, the subsequent digital representations are modified using the coupling coefficients to generate crosstalk-corrected digital representations. In some embodiments, this step includes modifying $D_1$ to generate a first crosstalk-corrected representation $D_{1\#}$ using $b_{12}$ and $b_{21}$ in accordance with equation 3, and modifying $D_2$ to generate a second crosstalk-corrected representation $D_{2\#}$ using $b_{12}$ and $b_{21}$ in accordance with equation 4, wherein in both equations A is substituted for X, B is substituted for Y, D is substituted for Z, $b_{12}$ is substituted for $c_{12}$, and $b_{21}$ is substituted for $c_{21}$. In some embodiments, all or a portion of the steps of the process 1100 are carried out at a signal-processing device, a general-purpose processor, using circuitry, or at another device operable to carry out all or a portion of the steps.

A process performed using the steps of (or steps similar to) the process 1100, describes a post-compensation embodiment where the signals are modified after the crosstalk occurs (i.e., after the signals are output from the ADCs.

In some embodiments, the coupling coefficients $c_{12}$ and $c_{21}$, or $b_{12}$ and $b_{21}$, as described with respect to the process 1000 and the process 1100, are used to correct a specific case of instantaneous crosstalk. In these cases, $c_{12}$ and $c_{21}$, or $b_{12}$ and $b_{21}$ are scalar values. However, in some situations, two (or more) of the digitizer ports couple, and overflowing waveforms experience memory effects (or become "smeared" in time). Memory in this context means that the digitizer response at a time instant of interest (that was otherwise intended to be uncorrelated with other time instances) depends on, and is influenced by, signal values in surrounding time instants. This is mathematically represented by convolution (rather than a simple multiplication, as in equations 1-4). In some embodiments, therefore, a more generalized process for crosstalk correction is used. In some embodiments, the relationship between $Y_1$ and $X_1$, is written as:

$$Y_1 = X_1 + h_{21} * X_2, \quad \text{(Equation 5)}$$

and the relationship between $Y_2$ and $X_2$ is written as:

$$Y_2 = X_2 + h_{12} * X_1. \quad \text{(Equation 6)}$$

In equation 5, $h_{21}$ represents a coupling coefficient that is a coupling finite impulse response (FIR) filter function for crosstalk strength and delay from the second digitizer to the first digitizer, where "*" represents the convolution (or filtering) operation. Alternatively, the symbol "×" can be used to represents the convolution (or filtering) operation. Likewise, in equation 6, $h_{12}$ represents a coupling coefficient that is a coupling FIR filter function for crosstalk strength and delay from the first digitizer to the second digitizer. The term "coupling coefficient" or "coupling coefficients" as used herein (e.g., to refer to $c_{12}$ and $c_{21}$, or $b_{12}$ and $b_{21}$, or $h_{12}$ and $h_{21}$) can refer to scalar quantities, vectors, or functions (e.g., FIR filter functions, or non-linear functions). This terminology can be used because the methods and systems described herein can operate similarly using coupling coefficients that are scalar quantities, vectors, or functions. Using equation 5 and equation 6, equation 3 and equation 4 can be rewritten as:

$$Z_{1\#} = Z_1 - h_{21} * Z_2 \quad \text{(Equation 7)}$$

and, $$Z_{3\#}=Z_2-h_{12}*Z_1 \qquad \text{(Equation 8)}$$

to express a generalized form of crosstalk correction.

Similarly, equations 5, 6, 7 and 8 can be applied to the ADC crosstalk compensation method described in 1100, by substituting A for X, B for Y, and D for Z.

In the equations used herein, the coupling coefficients $c_{12}$ and $c_{21}$ refer to scalar coupling coefficients describing crosstalk strength between channels in a DAC. In the equations used herein, the coupling coefficients $b_{12}$ and $b_{21}$ refer to scalar coupling coefficients describing crosstalk strength between channels in an ADC. In the equations used herein, the coupling coefficients $h_{12}$ and $h_{21}$ refer to coupling finite impulse response (FIR) filter functions for crosstalk strength and delay (i.e., with memory) between channels in a DAC or an ADC. In the equations used herein, the coupling coefficients $cc_{12}$ and $cc_{21}$ refer to any scalar or non-scalar coupling coefficients between channels in a DAC (e.g., coupling finite impulse response (FIR) filter functions, or nonlinear functions for crosstalk strength with or without delay between channels in a DAC). In the equations used herein, the coupling coefficients $bb_{12}$ and $bb_{21}$ refer to any scalar or non-scalar coupling coefficients between channels in an ADC (e.g., coupling finite impulse response (FIR) filter functions, or nonlinear functions for crosstalk strength with or without delay between channels in an ADC).

In some embodiments, the coupling coefficients $h_{12}$ and $h_{21}$ can be determined using signals that are either known, or not known. For example, the signals in steps 1005-1020, and 1105-1120 in the methods described above could be any signals, including known and unknown signals, and the coupling coefficients $h_{12}$ and $h_{21}$ with memory can be determined using these methods. To illustrate non-limiting examples of this, refer to the systems 500 in FIGS. 5A and 5B, and 600 in FIGS. 6A and 6B. These systems 500 and 600 can be used to determine the coupling coefficients $h_{12}$ and $h_{21}$ with memory using known or unknown input signals. In the case that the signals are not known, then the coupling coefficients $h_{12}$ and $h_{21}$ with memory can be determined by taking ratios of the outputs, similarly to the methods described above for determining $c_{12}$ and $c_{21}$, and $b_{12}$ and $b_{21}$ when the signals are unknown.

In other embodiments, two (or more) of the digitizer ports couple, and overflowing waveforms experience crosstalk that can be described by coupling functions with or without memory effects. This is mathematically represented by function operation (rather than a simple multiplication as in equations 1-4, or convolution as in equations 5-8). In some embodiments, therefore, the relationship between $Y_1$ and $X_1$, is written as:

$$Y_1=X_1+f_{21}(X_2), \qquad \text{(Equation 9)}$$

and the relationship between $Y_2$ and $X_2$ is written as:

$$Y_2=X_2+f_{12}(X_1). \qquad \text{(Equation 10)}$$

In equation 5, $f_{21}$ ($X_2$) represents a coupling function describing crosstalk strength (and optionally memory or delay) from the second digitizer to the first digitizer, where the function operates on $X_2$. Likewise, in equation 6, $f_{21}$ ($X_2$) represents a coupling function describing crosstalk strength (and optionally memory or delay) from the first digitizer to the second digitizer, where the function operates on $X_1$. The coupling functions $f_{21}$ and $f_{12}$ can be linear functions with or without memory effects, or non-linear functions with or without memory effects. The coupling functions $f_{21}$ and $f_{12}$ can transform a signal (e.g., $X_1$ or $X_2$) by a continuous nonlinear function, or a nonlinear function that is piece-wise linear, or a nonlinear polynomial, or a piece-wise nonlinear polynomial. In some embodiments, the coupling functions $f_{21}$ and $f_{12}$ are nonlinear functions that are quadratic, cubic, quantic, higher degree (i.e., $5^{th}$, $6^{th}$, $7^{th}$, or greater than $4^{th}$ degree), logarithmic, exponential, sinusoidal, inverse-sinusoidal, or sigmoidal. The coupling functions $f_{21}$ and $f_{12}$ can also be used to describe a transformation of a signal (e.g., $X_1$ or $X_2$) using a look-up-table (LUT). Using equation 9 and equation 10, equation 3 and equation 4 can be rewritten as:

$$Z_{1\#}=Z_1-f_{21}(Z_2), \qquad \text{(Equation 11)}$$

and, $$Z_{2\#}=Z_2-f_{12}(Z_1), \qquad \text{(Equation 12)}$$

to express a generalized form of crosstalk correction.

Similarly, equations 9, 10, 11 and 12 can be applied to the ADC crosstalk compensation method described in 1100, by substituting A for X, B for Y, and D for Z.

In some embodiments, the coupling functions $f_{21}$ and $f_{12}$ with or without memory effects can be determined using signals that are either known, or not known. For example, the signals in steps 1005-1020, and 1105-1120 in the methods described above could be any signals, including known and unknown signals, and the coupling functions $f_{21}$ and $f_{12}$ (with or without memory) can be determined using these methods. To illustrate non-limiting examples of this, refer to the systems 500 in FIGS. 5A and 5B, and 600 in FIGS. 6A and 6B. These systems 500 and 600 can be used to determine the coupling functions $f_{21}$ and $f_{12}$ using known or unknown input signals. In the case that the signals are not known, then the coupling functions $f_{21}$ and $f_{12}$ can be determined by taking ratios of the outputs, similarly to the methods described above for determining $c_{12}$ and $c_{21}$, and $b_{12}$ and $b_{21}$ when the signals are unknown.

Figure 12A:
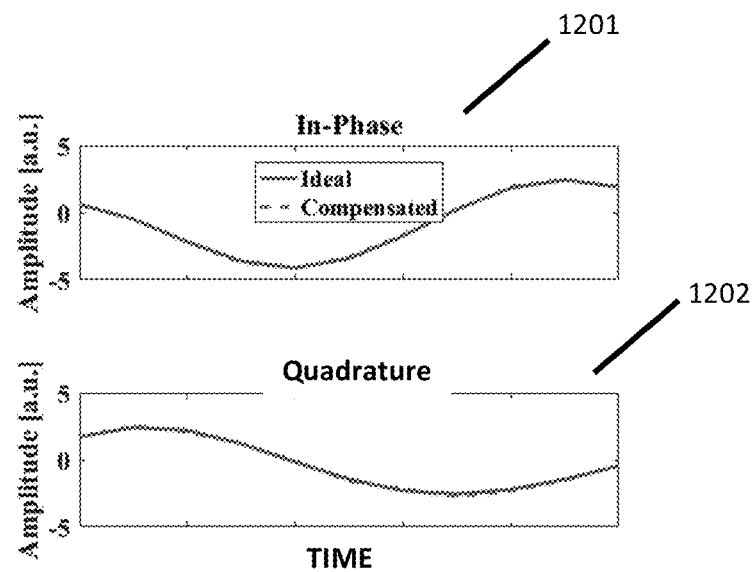
FIG. 12A shows simplified graphs of in-phase and quadrature analog outputs of a multichannel DAC after crosstalk-correction.

FIG. 12A shows simplified graphs of in-phase and quadrature analog outputs of a multichannel DAC after crosstalk-correction, performed using the steps of (or steps similar to) the process 1000, as was described with respect to FIG. 10.

The dashed line of graph 1201 shows an excerpt of a crosstalk-corrected first analog signal output from a first DAC of the multichannel DAC that is affected by crosstalk. The crosstalk-corrected first analog signal output represents the in-phase component of a signal. Similarly, the dashed line shown in graph 1202 shows an excerpt of a crosstalk-corrected second analog signal output from a second DAC of the multichannel DAC that is affected by crosstalk. The crosstalk-corrected second analog signal output represents the quadrature component of the signal.

As shown, the crosstalk-corrected first analog output shown in graph 1201 as a dashed line does not noticeably diverge from an ideal first analog output (shown as a solid grey line) in graph 1201. Likewise, the crosstalk-corrected second analog output shown in graph 1202 as a dashed line does not diverge significantly from an ideal second analog output (shown as a solid grey line) in graph 1202.

Figure 12B:
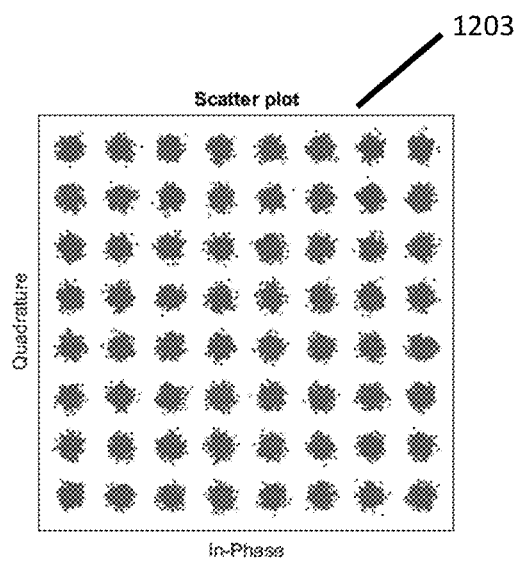
FIG. 12B shows a simplified constellation diagram after crosstalk-correction.

FIG. 12B shows a simplified constellation diagram after crosstalk-correction. As shown, the warping due to crosstalk, as was shown in constellation diagram 1203, has been substantially removed, thus returning the constellation diagram to a square shape with desirable equal vertical and horizontal spacing.

In accordance with some embodiments, crosstalk can be corrected (e.g., inverted, canceled, eliminated, removed) on more than two ports (inputs or outputs). In accordance with some embodiments, crosstalk can be corrected on a pair-wise basis in a DAC with more than two outputs or an ADC with more than two inputs.

In accordance with some embodiments, crosstalk can be corrected on all outputs of a digitizer simultaneously. In accordance with some embodiments, crosstalk can be corrected on all inputs of a digitizer simultaneously. In accordance with some embodiments, crosstalk can be corrected at multiple-input-multiple-output (MIMO) bases (e.g., by matrix inversion of the crosstalk impulse response).

In accordance with some embodiments, crosstalk can be corrected assuming there is no memory in the DAC/ADC response. In accordance with some embodiments, crosstalk can be corrected assuming memory in the DAC/ADC response.

In accordance with some embodiments, crosstalk-correction is not limited to single or multichannel digitizers. In accordance with some embodiments, crosstalk-correction is not limited to DACs. In accordance with some embodiments, crosstalk-correction is not limited to ADCs. In accordance with some embodiments, crosstalk can be corrected for an optical communication system by also considering polarization crosstalk in the optical part of the system (e.g., not just the DAC/ADC portion of the optical system).

In accordance with some embodiments, crosstalk-correction can include nonlinear crosstalk-correction (either assuming there is memory, or assuming there is no memory). In accordance with some embodiments, crosstalk-correction can be based on model-based parameters. In some embodiments, the coupling coefficients, as described above, can operate according to nonlinear functions that are related to the nonlinear crosstalk in the system.

In accordance with some embodiments, crosstalk-correction can be performed as post-compensation after an ADC (either assuming there is memory, or assuming there is no memory) and/or including the nonlinear crosstalk. In accordance with some embodiments, response characterization (used for later equalization) is performed once, or periodically, by means of training sequences, pilot symbols, etc.

In accordance with some embodiments, the crosstalk-correction process can be varied in time (e.g., based on the ambient variations that are acquired/communicated externally). In accordance with some embodiments, aspects of crosstalk-correction (e.g., coupling coefficients) can be determined by solving an over-determined least squares problem, instead of an N by N problem, where N denotes the number of ports crosstalk is corrected on. In accordance with some embodiments, aspects of crosstalk-correction (e.g., coupling coefficients) can be determined by solving an N by N problem, where N denotes the number of ports crosstalk is corrected on.

In accordance with some embodiments, aspects of crosstalk-correction (e.g., coupling coefficients) can be determined by a variation of a stochastic gradient method, and after its satisfactory convergence.

In accordance with some embodiments, aspects of crosstalk-correction (e.g., coupling coefficients) can be determined by a variation of an adaptive filtering process. In accordance with some embodiments, aspects of crosstalk-correction (e.g., coupling coefficients) can be determined by a variation of a least-means-square (LMS) process.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
providing first digital representations of a first analog signal;
inputting the first digital representations into a multichannel digital-to-analog converter (DAC) with crosstalk between channels;
analyzing the crosstalk between the channels to determine coupling coefficients for crosstalk strength between channels;
providing second digital representations of a second analog signal;
pre-compensating the second digital representations using the determined coupling coefficients; and
inputting the pre-compensated second digital representations into the multichannel DAC to produce the second analog signals, wherein the crosstalk between the channels of the produced second analog signals is mitigated.

2. The method of claim 1, wherein the crosstalk between the channels is analyzed using a method comprising:
a. inputting a first channel of the first digital representation of the first analog signal into a first channel of the multichannel digital-to-analog converter (DAC);
b. providing analog-to-digital converters (ADCs) coupled to the output of each channel of the DAC, wherein the ADCs induce no crosstalk effects;
c. comparing the outputs of the ADCs with the first channel of the first digital representation to determine the coupling coefficients between the first channel and the other channels of the multichannel DAC; and
d. repeating steps a. through c. for each subsequent channel of the multichannel DAC until the crosstalk between each input channel and all other output channels of the multichannel DAC are determined.

3. The method of claim 1, wherein the coupling coefficients are instantaneous and consist of scalar quantities.

4. The method of claim 1, wherein the crosstalk between the channels of the digital-to-analog converter (DAC) comprise memory effects and the coupling coefficients comprise finite-impulse-response (FIR) filter functions.

5. The method of claim 1, wherein the multichannel digital-to-analog converter (DAC) is used in a transmitter of a communication system.

6. The method of claim 5, wherein the communication system is selected from the group consisting of a free-space optical communication system, a fiber-optic optical communication system, and a radio-frequency communication system.

7. The method of claim 6, further comprising:
providing a receiver comprising a multichannel analog-to-digital converter (ADC),
providing electrical couplings connecting the different channels of the multichannel digital-to-analog converter (DAC) and the multichannel ADC to the rest of the communication system, wherein there is crosstalk between the channels of the electrical couplings;
providing a crosstalk estimation processor;
measuring the output from the receiver using the crosstalk estimation processor;
estimating the amount of crosstalk between the output channels of the receiver using the crosstalk estimation processor; and
adjusting the coupling coefficients in the pre-compensation of the DAC in the transmitter.

8. A method comprising:
providing a first analog signal with corresponding first digital representations;
inputting the first analog signals into a multichannel analog-to-digital converter (ADC) with crosstalk between channels;
analyzing the crosstalk between the channels to determine coupling coefficients for crosstalk strength between the channels;
providing a second analog signal with corresponding second digital representations;
inputting the second analog signals into the multichannel ADC to produce the second digital representations using the multichannel ADC; and
post-compensating the produced second digital representations using the determined coupling coefficients, wherein the crosstalk between the channels of the produced second digital representations is mitigated.

9. The method of claim 8, wherein the crosstalk between the channels is analyzed using a method comprising:
a. providing digital-to-analog converters (DACs) coupled to the input of each channel of the multichannel analog-to-digital converter (ADC), wherein the DACs induce no crosstalk effects;
b. inputting a first channel of the first digital representation of the first analog signal into the DAC coupled to the first channel of the ADC;
c. comparing the outputs of the ADC with the first channel of the first digital representation to determine the coupling coefficients between the first channel and the other channels of the multichannel ADC; and
d. repeating steps a. through c. for each subsequent channel of the multichannel ADC until the crosstalk between each input channel and all other output channels of the multichannel ADC are determined.

10. The method of claim 8, wherein the coupling coefficients are instantaneous and consist of scalar quantities.

11. The method of claim 8, wherein the crosstalk between the channels of the analog-to-digital converter (ADC) comprise memory effects and the coupling coefficients comprise finite-impulse-response (FIR) filter functions.

12. The method of claim 8, wherein the multichannel analog-to-digital converter (ADC) is used in a receiver of a communication system.

13. The method of claim 12, wherein the communication system is selected from the group consisting of a free-space optical communication system, a fiber-optic optical communication system, and a radio-frequency communication system.

14. The method of claim 13, further comprising:
providing a transmitter comprising a multichannel digital-to-analog converter (DAC);
providing electrical couplings connecting the different channels of the multichannel DAC and the multichannel analog-to-digital converter (ADC) to the rest of the communication system, wherein there is crosstalk between the channels of the electrical couplings;
providing a crosstalk estimation processor;
measuring the output from the receiver using the crosstalk estimation processor;
estimating the amount of crosstalk between the output channels of the receiver using the crosstalk estimation processor; and
adjusting the coupling coefficients in the post-compensation of the ADC in the receiver.

15. A method comprising:
generating first and second known digital representations of first and second known analog signals ($X_1$ and $X_2$), respectively;
inputting the first and second known digital representation to first and second channels of a multichannel digital-to-analog converter (DAC), respectively, to output first and second generated analog signals ($Y_1$ and $Y_2$), respectively;
analyzing the first and second generated analog signals in relation to the first and second known analog signal to generate a coupling coefficient ($cc_{12}$) for crosstalk strength from the first to the second DAC channels according to a formula $Y_2 = X_2 + cc_{12} \times X_1$, and a coupling coefficient ($cc_{21}$) for crosstalk strength from the second to the first DAC channels according to a formula $Y_1 = X_1 + cc_{21} \times X_2$;
generating a first subsequent digital representation ($Z_1$) of a first subsequent analog signal;
generating a second subsequent digital representation ($Z_2$) of a second subsequent analog signal;
modifying the first subsequent digital representation ($Z_1$) to generate a first modified digital representation ($Z_{1\#}$);
modifying the second subsequent digital representation ($Z_2$) to generate a second modified digital representation ($Z_{2\#}$); and
inputting the first and second modified digital representations to the first and second DAC channels, respectively, to output first and second modified analog signals that substantially match the first and second subsequent analog signals, respectively.

16. The method of claim 15, wherein the crosstalk between the channels is analyzed using a method comprising:
a. inputting the first known digital representation of the first known analog signal into a first channel of the multichannel digital-to-analog converter (DAC);
b. providing analog-to-digital converters (ADCs) coupled to the output of each channel of the DAC, wherein the ADCs induce no crosstalk effects;
c. comparing the outputs of the ADCs with the first known digital representation to determine the coupling coefficients between the first channel and the other channels of the multichannel DAC; and
d. repeating steps a. through c. for each subsequent channel of the multichannel DAC until the crosstalk between each input channel and all other output channels of the multichannel DAC are determined.

17. The method of claim 15, wherein:
the coupling coefficients $cc_{12}$ and $cc_{21}$ are instantaneous and consist of scalar quantities;
the first modified digital representation ($Z_{1\#}$) comprises the formula:

$$Z_{1\#} = (Z_1 - cc_{21} \times Z_2)/(1 - cc_{12} \times cc_{21}); \text{ and}$$

the second modified digital representation ($Z_{2\#}$) comprises the formula:

$$Z_{2\#} = (Z_2 - cc_{12} \times Z_1)/(1 - cc_{12} \times cc_{21}).$$

18. The method of claim 15, wherein:
the crosstalk between the channels of the digital-to-analog converter (DAC) comprise memory effects and the coupling coefficients $cc_{12}$ and $cc_{21}$ comprise finite-impulse-response (FIR) filter functions;
the first modified digital representation ($Z_{1\#}$) comprises the formula:

$Z_{1\#}=Z_1-cc_{21} \times Z_2$; and the second modified digital representation ($Z_{2\#}$) comprises the formula:

$Z_{2\#}=Z_2-cc_{12} \times Z_1$.

19. The method of claim 15, wherein the multichannel digital-to-analog converter (DAC) is used in a transmitter of a communication system.

20. The method of claim 19, wherein the communication system is selected from the group consisting of a free-space optical communication system, a fiber-optic optical communication system, and a radio-frequency communication system.

21. The method of claim 20, further comprising:
providing a receiver comprising a multichannel analog-to-digital converter (ADC);
providing electrical couplings connecting the different channels of the multichannel digital-to-analog converter (DAC) and the multichannel ADC to the rest of the communication system, wherein there is crosstalk between the channels of the electrical couplings;
providing a crosstalk estimation processor;
measuring the output from the receiver using the crosstalk estimation processor;
estimating the amount of crosstalk between the output channels of the receiver using the crosstalk estimation processor; and
adjusting the coupling coefficients in pre-compensation of the DAC in the transmitter.

22. A method comprising:
generating first and second known analog signals having first and second known digital representations ($A_1$ and $A_2$), respectively;
inputting the first and second known analog signals to first and second channels of a multichannel analog-to-digital converter (ADC), respectively, to output first and second generated digital representations ($B_1$ and $B_2$), respectively;
analyzing the first and second generated digital representations in relation to the first and second known digital representations to generate a coupling coefficient ($bb_{12}$) for crosstalk strength from the first to the second ADC channels according to a formula $B_2=A_2+bb_{12} \times A_1$, and a coupling coefficient ($bb_{21}$) for crosstalk strength from the second to the first ADC channels according to a formula $B_1=A_1+bb_{21} \times A_2$;
inputting a first subsequent analog signal to the first ADC channel to output a first subsequent digital representation ($D_1$) of the first subsequent analog signal;
inputting a second subsequent analog signal to the second ADC channel to output a second subsequent digital representation ($D_2$) of the second subsequent analog signal;
modifying the first subsequent digital representation ($D_1$) to generate a first crosstalk-corrected digital representation ($D_{1\#}$); and
modifying the second subsequent digital representation ($D_2$) to generate a second crosstalk-corrected digital representation ($D_{2\#}$).

23. The method of claim 22, wherein the crosstalk between the channels is analyzed using a method comprising:
a. providing digital-to-analog converters (DACs) coupled to the input of each channel of the multichannel analog-to-digital converter (ADC), wherein the DACs induce no crosstalk effects;
b. inputting the first known digital representation of the first known analog signal into the DAC coupled to the first channel of the ADC;
c. comparing the outputs of the ADC with the first known digital representation to determine the coupling coefficients between the first channel and the other channels of the multichannel ADC; and
d. repeating steps a. through c. for each subsequent channel of the multichannel ADC until the crosstalk between each input channel and all other output channels of the multichannel ADC are determined.

24. The method of claim 22, wherein:
the coupling coefficients $bb_{12}$ and $bb_{21}$ are instantaneous and consist of scalar quantities;
the first modified digital representation ($D_{1\#}$) comprises the formula:

$D_{1\#}=(D_1-bb_{21} \times D_2)/(1-bb_{12} \times bb_{21})$; and the second modified digital representation ($D_{2\#}$) comprises the formula:

$D_{2\#}=(D_2-bb_{12} \times D_1)/(1-bb_{12} \times bb_{21})$.

25. The method of claim 22, wherein:
the crosstalk between the channels of the analog-to-digital converter (ADC) comprise memory effects and the coupling coefficients $bb_{12}$ and $bb_{21}$ comprise finite-impulse-response (FIR) filter functions;
the first modified digital representation ($D_{1\#}$) comprises the formula:

$D_{1\#}=D_1-bb_{21} \times D_2$; and the second modified digital representation ($D_{2\#}$) comprises the formula:

$D_{2\#}=D_2-bb_{12} \times D_1$.

26. The method of claim 22, wherein the multichannel analog-to-digital converter (ADC) is used in a receiver of a communication system.

27. The method of claim 26, wherein the communication system is selected from the group consisting of a free-space optical communication system, a fiber-optic optical communication system, and a radio-frequency communication system.

28. The method of claim 27, further comprising:
providing a transmitter comprising a multichannel digital-to-analog converter (DAC);
providing electrical couplings connecting the different channels of the multichannel DAC and the multichannel analog-to-digital converter (ADC) to the rest of the communication system, wherein there is crosstalk between the channels of the electrical couplings;
providing a crosstalk estimation processor;
measuring the output from the receiver using the crosstalk estimation processor;
estimating the amount of crosstalk between the output channels of the receiver using the crosstalk estimation processor; and
adjusting the coupling coefficients in post-compensation of the ADC in the receiver.

* * * * *